(12) United States Patent
Kim et al.

(10) Patent No.: US 10,641,811 B2
(45) Date of Patent: May 5, 2020

(54) METHOD FOR DETECTING LEAKAGE CURRENT AND ELECTRONIC DEVICE SUPPORTING THE SAME

(71) Applicant: Samsung Electronics Co., Ltd., Gyeonggi-do (KR)

(72) Inventors: Du-Hyun Kim, Gyeonggi-do (KR); Hoyeong Lim, Gyeonggi-do (KR); Yongseung Yi, Seoul (KR); Dong-Il Son, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 246 days.

(21) Appl. No.: 15/494,843

(22) Filed: Apr. 24, 2017

(65) Prior Publication Data

US 2017/0363672 A1    Dec. 21, 2017

(30) Foreign Application Priority Data

Jun. 16, 2016    (KR) .......................... 10-2016-0075147

(51) Int. Cl.
 *G01R 31/02*    (2006.01)
 *H01M 2/10*    (2006.01)
 *G06F 1/3287*    (2019.01)
 *G01R 19/00*    (2006.01)

(52) U.S. Cl.
 CPC ....... *G01R 31/025* (2013.01); *G01R 19/0092* (2013.01); *G06F 1/3287* (2013.01); *H01M 2/1022* (2013.01)

(58) Field of Classification Search
 CPC ............ G01R 31/025; G01R 19/0092; H01M 2/1022; H02J 1/00; G06F 1/3287
 See application file for complete search history.

(56) References Cited

U.S. PATENT DOCUMENTS

| | | | | |
|---|---|---|---|---|
| 6,018,232 A | * | 1/2000 | Nelson | G06F 1/3209 320/127 |
| 2009/0009187 A1 | * | 1/2009 | Kwak | G06F 13/4081 324/630 |
| 2015/0102800 A1 | * | 4/2015 | Deokar | G01R 31/026 324/76.11 |
| 2015/0168471 A1 | * | 6/2015 | Truong | G01R 31/023 324/66 |
| 2015/0323979 A1 | | 11/2015 | Kaestner | |

(Continued)

*Primary Examiner* — Jeff W Natalini
(74) *Attorney, Agent, or Firm* — Cha & Reiter, LLC

(57) ABSTRACT

An electronic device according to various exemplary embodiments of the present invention may include one or more switches, one of more sub-systems, and an interface control unit electrically coupled with the one or more sub-systems and the one or more switches. The interface control unit is configured to: detect a coupling of an external device to the electronic device, identify a type of the coupled external device, when the external device is identified as a current detecting device, generate a first control signal for turning off power to the one or more sub-systems, and a second control signal for setting a first path to supply the one or more sub-systems with power from the current detecting device, and transmit the first control signal to the one or more sub-systems and the second control signal to the one or more switches.

17 Claims, 13 Drawing Sheets

(56) References Cited

U.S. PATENT DOCUMENTS

2016/0179648 A1* 6/2016 Srivastava .......... G06F 11/3051
710/16
2017/0010659 A1* 1/2017 Park ..................... G06F 1/26
2017/0229884 A1* 8/2017 Tosch ................... H02J 7/0031

* cited by examiner

METHOD FOR DETECTING LEAKAGE CURRENT AND ELECTRONIC DEVICE SUPPORTING THE SAME

CLAIM OF PRIORITY

This application claims priority under 35 U.S.C. § 119(a) to a Korean Patent Application Serial No. 10-2016-0075147, which was filed in the Korean Intellectual Property Office on Jun. 16, 2016, the entire content of which is hereby incorporated by reference.

BACKGROUND

1. Field of the Invention

Various exemplary embodiments of the present invention relate to a method for detecting a leakage current and an electronic device supporting the same.

2. Description of the Related Art

In recent years, electronic devices (e.g., portable terminals) support various functions for users. For example, the electronic devices provide functions such as maintaining users' contacts, games, calendar schedulers, short message services, multimedia message services, cell broadcasting services, Internet services, electronic mails (e-mails), alarms, multimedia and audio playback, digital cameras and the like. Accordingly, battery life of these devices is increasingly important. And as the battery capacities increase, the sizes of the batteries also increase, and thereby the entire sizes of the electronic devices correspondingly increase. To reduce the sizes of the batteries of the electronic devices in order to provide a slim device, designers or manufacturers are implementing electronic devices embedding integrated batteries where batteries (or battery packs) are integrally combined (or assembled) with housings of the electronic devices.

SUMMARY

When the battery is attachable and detachable from a housing of the electronic device, the battery may be isolated from the housing of the electronic device and then an external power source is inputted to a contact terminal (e.g., a connector) of the electronic device. By doing so, a leakage current generated in systems (e.g., a main board) of the electronic device during a power-off state can be measured. However, when the battery is integrally combined within a housing of the electronic device, a problem arises such that the leakage current cannot be measured because the battery cannot be isolated from the electronic device.

Various exemplary embodiments of the present disclosure provide a method for detecting a leakage current generated in an electronic device in which a battery is integrally combined within a housing of the electronic device, and the electronic device supporting the same.

Technological solutions that the embodiments of the present invention seeks to achieve are not limited to the above-mentioned technological solutions, and other technological solutions not mentioned above will be clearly understood by a person having ordinary skill in the art from the following disclosure.

An electronic device according to various exemplary embodiments of the present invention may include one or more switches, one of more sub-systems, and an interface control unit electrically coupled with the one or more sub-systems and the one or more switches. The interface control unit is configured to: detect a coupling of an external device to the electronic device, identify a type of the coupled external device, when the external device is identified as a current detecting device, generate a first control signal for turning off power to the one or more sub-systems, and a second control signal for setting a first path to supply the one or more sub-systems with power from the current detecting device, and transmit the first control signal to the one or more sub-systems and the second control signal to the one or more switches.

A method according to various exemplary embodiments of the present invention, may include the operations of detecting, by an interface control unit, a coupling of an external device to an electronic device; identifying, by the interface control unit, a type of the coupled external device; when the external device is identified as a current detecting device, generating, by the interface control unit, a first control signal for turning off power to one or more sub-systems of the electronic device, and a second control signal for setting a first path to supply the one or more sub-systems with power from the current detecting device; and transmitting, by the interface control unit, the first control signal to the one or more sub-systems and the second control signal to one or more switches.

DETAILED DESCRIPTION

Figure 1:
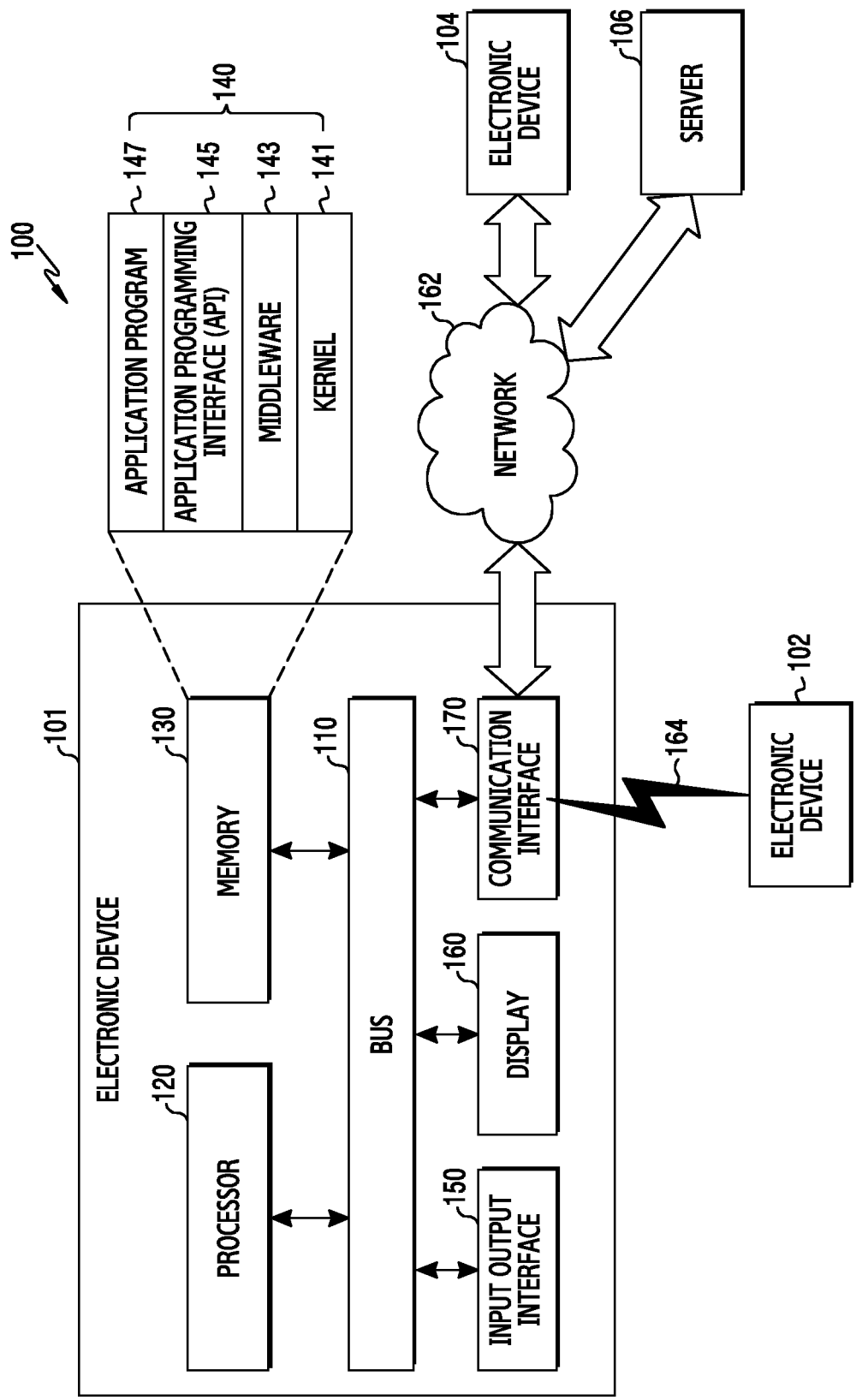
FIG. 1 illustrates an environment of a network including an electronic device according to one exemplary embodiment of the present disclosure.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including both at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HIVID)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 illustrates a network environment including an electronic device according to one embodiment of the present disclosure.

An electronic device 101 within a network environment 100, according to various embodiments, will be described with reference to FIG. 1. The electronic device 101 may include a bus 110, a processor 120, a memory 130, an input/output interface 150, a display 160, and a communication interface 170. In some embodiments, the electronic device 101 may omit at least one of the above elements or may further include other elements.

The bus 110 may include, for example, a circuit for connecting the elements 110-170 and transferring communication (e.g., control messages and/or data) between the elements. The processor 120 may include one or more of a Central Processing Unit (CPU), an Application Processor (AP), and a Communication Processor (CP). The processor 120, for example, may carry out operations or data processing relating to control and/or communication of at least one other element of the electronic device 101.

The memory 130 may include a volatile memory and/or a non-volatile memory. The memory 130 may store, for example, instructions or data relevant to at least one other element of the electronic device 101. According to an embodiment, the memory 130 may store software and/or a program 140. The program 140 may include, for example, a kernel 141, middleware 143, an Application Programming Interface (API) 145, and/or application programs (or "applications") 147. At least some of the kernel 141, the middleware 143, and the API 145 may be referred to as an Operating System (OS).

The kernel 141 may control or manage system resources (e.g., the bus 110, the processor 120, or the memory 130) used for performing an operation or function implemented by the other programs (e.g., the middleware 143, the API 145, or the application programs 147). Furthermore, the kernel 141 may provide an interface through which the middleware 143, the API 145, or the application programs 147 may access the individual elements of the electronic device 101 to control or manage the system resources.

The middleware 143, for example, may function as an intermediary for allowing the API 145 or the application programs 147 to communicate with the kernel 141 to exchange data. In addition, the middleware 143 may process one or more operation requests received from the application program 147 according to priority. For example, the middleware 143 may give priority to use the system resources of the electronic device 101 (for example, the bus 110, the processor 120, the memory 130, and the like) to at least one of the application programs 147. For example, the middleware 143 may perform scheduling or load balancing with respect to the one or more operation requests by processing the one or more operation requests according to the priority given to the at least one application program.

The API 145 is an interface through which the applications 147 control functions provided from the kernel 141 or the middleware 143, and may include, for example, at least one interface or function (e.g., instruction) for file control, window control, image processing, or text control.

The input/output interface 150, for example, may function as an interface that may transfer instructions or data input from a user or another external device to the other element(s) of the electronic device 101. Furthermore, the input/output interface 150 may output the instructions or data received from the other element(s) of the electronic device 101 to the user or another external device.

The display 160 may include, for example, a Liquid Crystal Display (LCD), a Light Emitting Diode (LED) display, an Organic Light Emitting Diode (OLED) display, a Micro Electro Mechanical System (MEMS) display, or an electronic paper display. The display 160, for example, may display various types of content (e.g., text, images, videos, icons, or symbols) for the user. The display 160 may include a touch screen and receive, for example, a touch, gesture, proximity, or hovering input using an electronic pen or the user's body part.

The communication interface 170, for example, may set communication between the electronic device 101 and an external device (e.g., the first external electronic device 102, the second external electronic device 104, or a server 106. For example, the communication interface 170 may be connected to a network 162 through wireless or wired communication to communicate with the external device (e.g., the second external electronic device 104 or the server 106).

The wireless communication may use at least one of, for example, Long Term Evolution (LTE), LTE-Advance (LTE-A), Code Division Multiple Access (CDMA), Wideband CDMA (WCDMA), Universal Mobile Telecommunications System (UMTS), WiBro (Wireless Broadband), and Global System for Mobile Communications (GSM), as a cellular communication protocol. In addition, the wireless communication may include, for example, short range communication 164. The short-range communication 164 may be performed by using at least one of, for example, Wi-Fi, Bluetooth, Bluetooth low energy (BLE), Near Field Communication (NFC), and Global Navigation Satellite System (GNSS). The GNSS may include at least one of, for example, a Global Positioning System (GPS), a Global Navigation Satellite System (Glonass), a Beidou Navigation Satellite System (hereinafter referred to as "Beidou"), and a European Global Satellite-based Navigation System (Galileo), according to a use area, a bandwidth, or the like. Hereinafter, in the present disclosure, the "GPS" may be interchangeably used with the "GNSS". The wired communication may include at least one of, for example, a Universal Serial Bus (USB), a High Definition Multimedia Interface (HDMI), Recommended Standard 232 (RS-232), and a Plain Old Telephone Service (POTS). The network 162 may include at least one of a communication network such as a computer network (e.g., a LAN or a WAN), the Internet, and a telephone network.

Each of the first and second external electronic devices 102 and 104 may be of a type identical to or different from that of the electronic device 101. According to an embodiment, the server 106 may include a group of one or more servers. According to various embodiments, all or some of the operations performed in the electronic device 101 may be performed in another electronic device or a plurality of electronic devices (e.g., the external electronic devices 102 and 104 or the server 106). According to an embodiment, when the electronic device 101 has to perform some functions or services automatically or in response to a request, the electronic device 101 may make a request for performing at least some functions relating thereto to another device (e.g., the external electronic device 102 or 104 or the server 106) instead of performing the functions or services by itself or in addition. Another electronic apparatus may execute the requested functions or the additional functions, and may deliver a result of the execution to the electronic device 101.

The electronic device 101 may process the received result as it is or additionally to provide the requested functions or services. To achieve this, for example, cloud computing, distributed computing, or client-server computing technology may be used.

Figure 2:
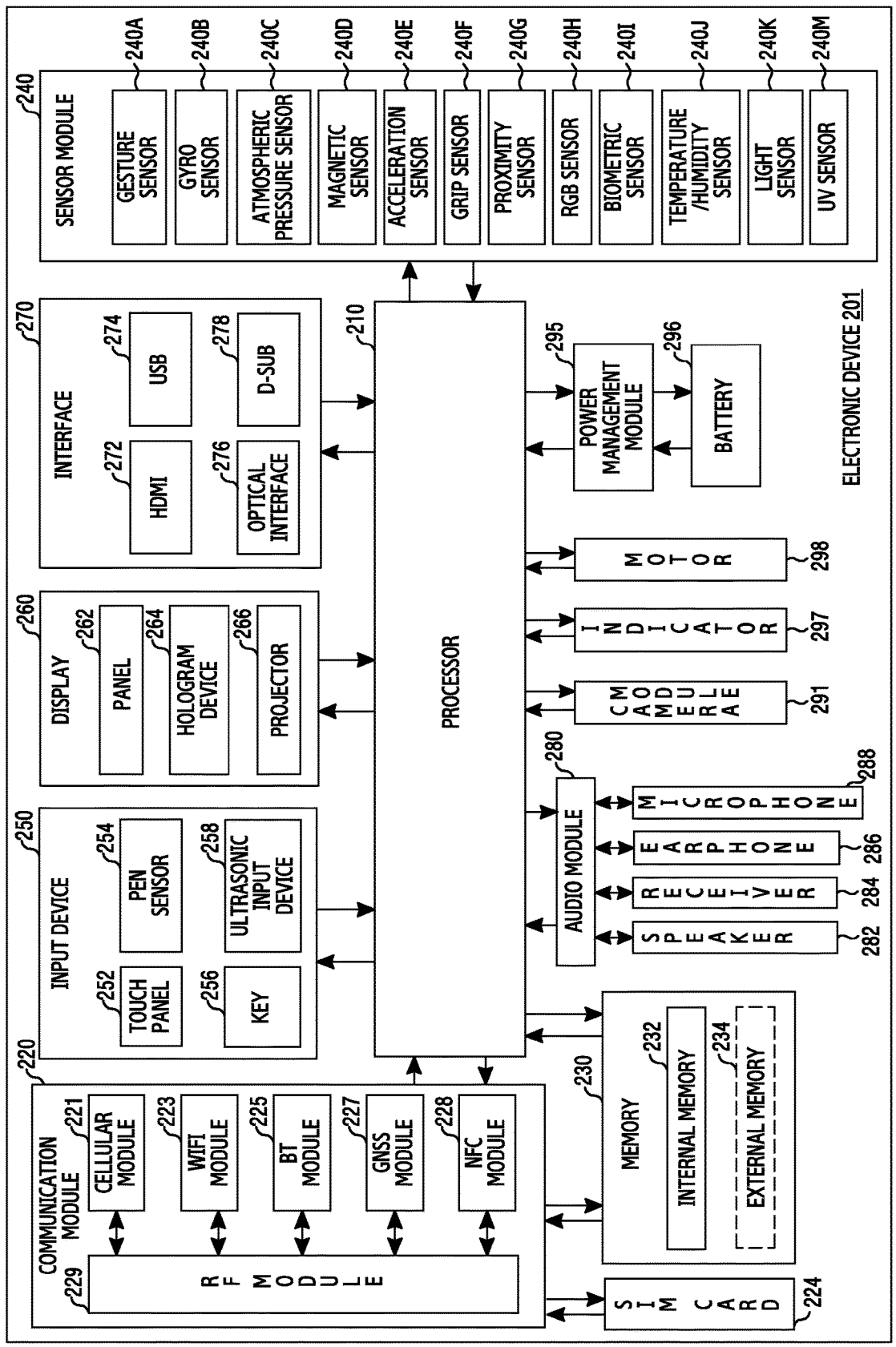
FIG. 2 illustrates a block diagram of an electronic device according to one exemplary embodiment of the present disclosure.

FIG. 2 is a block diagram illustrating an electronic device according to one embodiment of the present disclosure.

FIG. 2 is a block diagram of an electronic device 201 according to one embodiment. For example, the electronic device 201 may include the whole or part of the electronic device 101 illustrated in FIG. 1. The electronic device 201 may include at least one processor (e.g., Application Processor (AP)) 210, a communication module 220, a Subscriber Identification Module (SIM) 224, a memory 230, a sensor module 240, an input device 250, a display 260, an interface 270, an audio module 280, a camera module 291, a power management module 295, a battery 296, an indicator 297, and a motor 298.

The processor 210 may control a plurality of hardware or software components connected to the processor 210 by driving an operating system or an application program and perform processing of various pieces of data and calculations. The processor 210 may be implemented by, for example, a System on Chip (SoC). According to an embodiment, the processor 210 may further include a Graphic Processing Unit (GPU) and/or an image signal processor. The processor 210 may include at least some (e.g., a cellular module 221) of the elements illustrated in FIG. 2. The processor 210 may load, into a volatile memory, instructions or data received from at least one (e.g., a non-volatile memory) of the other elements and may process the loaded instructions or data, and may store various data in a non-volatile memory. The processor 210 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc.

In an embodiment, the processor 120 may receive information on the current impedance of the antenna, and perform an impedance matching operation at least partially based on the received information on the current impedance of the antenna. The communication module 220 may have a configuration equal or similar to that of the communication interface 170 of FIG. 1. The communication module 220 may include, for example, the cellular module 221, a Wi-Fi module 223, a Bluetooth (BT) module 225, a GNSS module 227 (e.g., a GPS module, a Glonass module, a Beidou module, or a Galileo module), an NFC module 228, and a Radio Frequency (RF) module 229.

The cellular module 221 may provide a voice call, image call, a text message service, or an Internet service through, for example, a communication network. According to an embodiment, the cellular module 221 may distinguish between and authenticate electronic devices 201 within a communication network using a subscriber identification module (for example, the SIM card 224).

According to an embodiment of the present disclosure, the cellular module 221 may perform at least some of the functions that the processor 210 may provide. According to an embodiment, the cellular module 221 may include a Communication Processor (CP).

Each of the Wi-Fi module 223, the BT module 225, the GNSS module 227, and the NFC module 228 may include, for example, a processor for processing data transmitted and received through the relevant module. According to some embodiments of the present disclosure, at least some (e.g., two or more) of the cellular module 221, the Wi-Fi module 223, the BT module 225, the GNSS module 227, and the NFC module 228 may be included in one Integrated Chip (IC) or IC package.

The RF module 229 may transmit/receive, for example, a communication signal (for example, an RF signal). The RF module 229 may include, for example, a transceiver, a Power Amplifier Module (PAM), a frequency filter, a Low Noise Amplifier (LNA), and an antenna.

In an embodiment, the RF module 229 may further include a plurality of matching circuits, sensors, and the like. For example, the sensor may sense a transmission signal transmitted from a Power amplifier module (PAM) and a reflection signal transmitted by the antenna, and may transmit the sensed transmission signal and reflection signal to the processor (e.g., processor 120).

In an embodiment, the sensor may include a coupler. However, the present disclosure is not limited thereto.

According to another embodiment of the present disclosure, at least one of the cellular module 221, the Wi-Fi module 223, the BT module 225, the GNSS module 227, and the NFC module 228 may transmit and receive RF signals through a separate RF module.

The subscriber identification module 224 may include, for example, a card including a subscriber identity module and/or an embedded SIM, and may contain unique identification information (e.g., an Integrated Circuit Card Identifier (ICCID)) or subscriber information (e.g., an International Mobile Subscriber Identity (IMSI)).

The memory 230 (for example, the memory 130) may include, for example, an internal memory 232 or an external memory 234. The embedded memory 232 may include at least one of a volatile memory (for example, a Dynamic Random Access Memory (DRAM), a Static RAM (SRAM), a Synchronous Dynamic RAM (SDRAM), and the like) and a non-volatile memory (for example, a One Time Programmable Read Only Memory (OTPROM), a Programmable ROM (PROM), an Erasable and Programmable ROM (EPROM), an Electrically Erasable and Programmable ROM (EEPROM), a mask ROM, a flash ROM, a flash memory (for example, a NAND flash memory or a NOR flash memory), a hard disc drive, a Solid State Drive (SSD), and the like).

The external memory 234 may further include a flash drive, for example, a Compact Flash (CF), a Secure Digital (SD), a Micro Secure Digital (Micro-SD), a Mini Secure Digital (Mini-SD), an eXtreme Digital (xD), a memory stick, or the like. The external memory 234 may be functionally and/or physically connected to the electronic device 201 through various interfaces.

The sensor module 240 may measure a physical quantity or detect an operation state of the electronic device 201, and may convert the measured or detected information into an electrical signal. For example, the sensor module 240 may include at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (for example, a Red/Green/Blue (RGB) sensor), a bio-sensor 240I, a temperature/humidity sensor 240J, a light sensor 240K, and an Ultra Violet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an Infrared (IR) sensor, an iris sensor, and/or a fingerprint sensor. The sensor module 240 may further include a control circuit for controlling one or more sensors included therein. In some embodiments of the present disclosure, the electronic device 201 may further include a processor configured to control the sensor module 240 as a part of or separately from the processor 210, and may control the sensor module 240 while the processor 210 is in a sleep state.

The input device 250 may include, for example, a touch panel 252, a (digital) pen sensor 254, a key 256, or an ultrasonic input device 258. The touch panel 252 may use at least one of, for example, a capacitive type, a resistive type, an infrared type, and an ultrasonic type. Also, the touch panel 252 may further include a control circuit. The touch panel 252 may further include a tactile layer and provide a tactile reaction to the user.

The (digital) pen sensor 254 may include, for example, a recognition sheet which is a part of the touch panel or is separated from the touch panel. The key 256 may include, for example, a physical button, an optical key or a keypad. The ultrasonic input device 258 may detect ultrasonic wavers generated by an input tool through a microphone (for example, a microphone 288) and identify data corresponding to the detected ultrasonic waves.

The display 260 (for example, the display 160) may include a panel 262, a hologram device 264 or a projector 266. The panel 262 may include a configuration that is identical or similar to the display 160 illustrated in FIG. 1. The panel 262 may be implemented to be, for example, flexible, transparent, or wearable. The panel 262 and the touch panel 252 may be implemented as one module. The hologram 264 may show a three dimensional image in the air by using an interference of light. The projector 266 may display an image by projecting light onto a screen. The screen may be located, for example, inside or outside the electronic device 201. According to an embodiment, the display 260 may further include a control circuit for controlling the panel 262, the hologram device 264, or the projector 266.

The interface 270 may include, for example, a High-Definition Multimedia Interface (HDMI) 272, a Universal Serial Bus (USB) 274, an optical interface 276, or a D-sub-miniature (D-sub) 278. The interface 270 may be included in, for example, the communication interface 170 illustrated in FIG. 1. Additionally or alternatively, the interface 270 may include, for example, a Mobile High-definition Link (MHL) interface, a Secure Digital (SD) card/Multi-Media Card (MMC) interface, or an Infrared Data Association (IrDA) standard interface.

The audio module 280 may bilaterally convert, for example, a sound and an electrical signal. At least some elements of the audio module 280 may be included in, for example, the input/output interface 150 illustrated in FIG. 1. The audio module 280 may process sound information which is input or output through, for example, a speaker 282, a receiver 284, earphones 286, the microphone 288 or the like.

The camera module 291 is a device which may photograph a still image and a dynamic image. According to an embodiment, the camera module 291 may include one or more image sensors (for example, a front sensor or a back sensor), a lens, an Image Signal Processor (ISP) or a flash (for example, LED or xenon lamp).

The power management module 295 may manage, for example, power of the electronic device 201. According to an embodiment, the power management module 295 may include a Power Management Integrated Circuit (PMIC), a charger Integrated Circuit (IC), or a battery or fuel gauge. The PMIC may use a wired and/or wireless charging method. Examples of the wireless charging method may include, for example, a magnetic resonance method, a magnetic induction method, an electromagnetic method, and the like. Additional circuits (e.g., a coil loop, a resonance circuit, a rectifier, etc.) for wireless charging may be further included. The battery gauge may measure, for example, a residual quantity of the battery 296, and a voltage, a current, or a temperature during the charging. The battery 296 may include, for example, a rechargeable battery or a solar battery.

In one exemplary embodiment, the power management module 295 can detect the coupling or non-coupling of an external device to the electronic device 101 and determine the type of the coupled external device. In one exemplary embodiment, the power management module 295 can determine whether to turn on or turn off a sub-system of the electronic device 201 in accordance with the type of the coupled external device. In one exemplary embodiment, the power management module 295 can set a path for supplying power from the coupled external device or from the battery 296 to the sub-system, in accordance with the type of the coupled external device. For example, in case where a current detecting device is coupled to the electronic device 101 to detect a leakage current of the electronic device 101, the power management module 295 can turn off one or more sub-systems of the electronic device 201, and control at least one switch to set a path for transmitting a current inputted from the power detecting device to the sub-systems. Regarding the operations of the power management module 295 for leakage current detection and the setting of the path of the power, a description will be made in detail in FIG. 4 below.

The indicator 297 may display a particular state (e.g., a booting state, a message state, a charging state, or the like) of the electronic device 201 or a part (e.g., the processor 210). The motor 298 may convert an electrical signal into mechanical vibration, and may generate vibration, a haptic effect, or the like. Although not illustrated, the electronic device 201 may include a processing unit (e.g., a GPU) for supporting a mobile television (TV). The processing unit for supporting mobile TV may, for example, process media data according to a certain standard such as Digital Multimedia Broadcasting (DMB), Digital Video Broadcasting (DVB), or mediaFLO™.

Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

Figure 3:
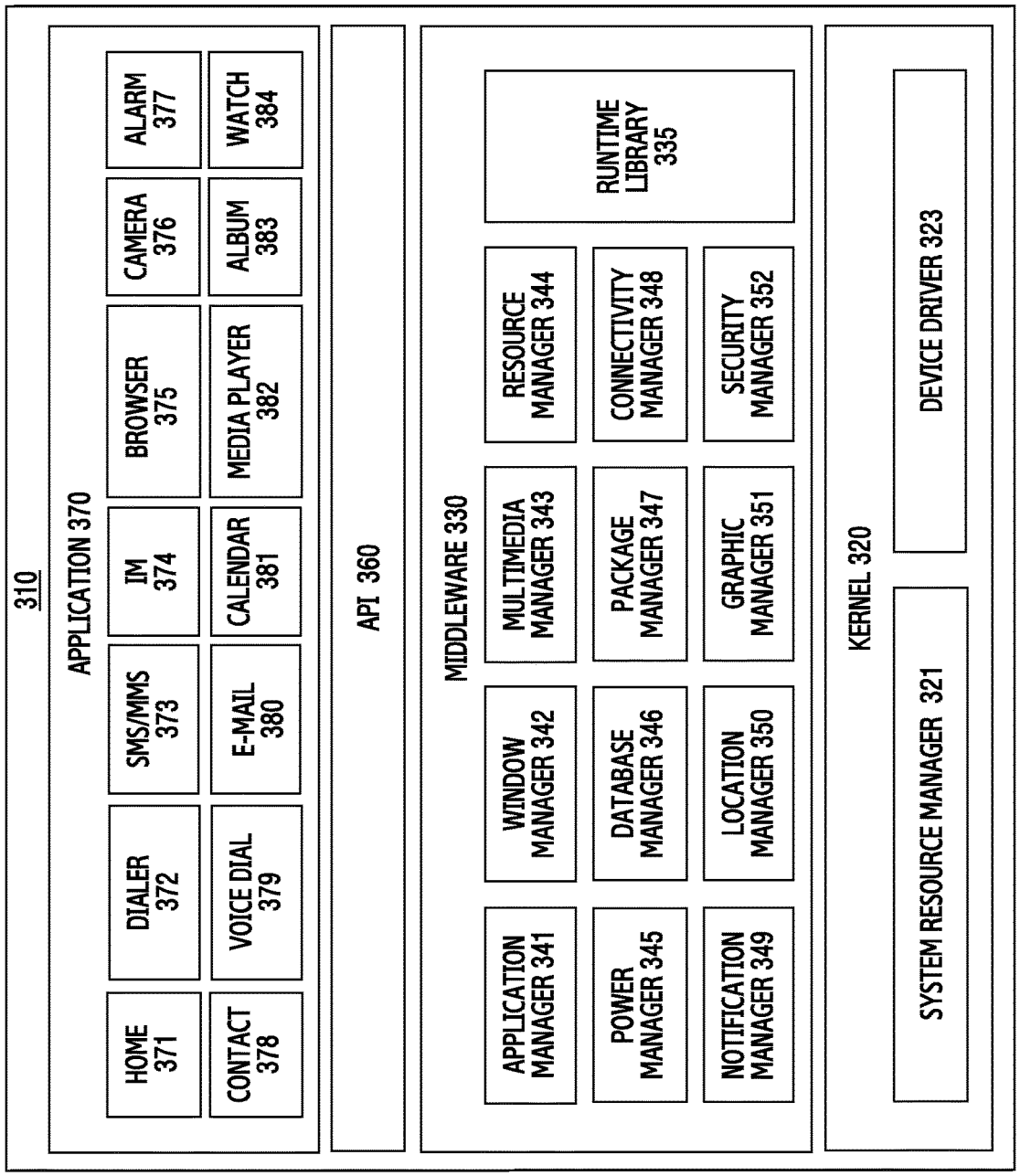
FIG. 3 is a block diagram of a program module according to one exemplary embodiment of the present disclosure.

FIG. 3 is a block diagram of a program module according to one embodiment of the present disclosure.

According to an embodiment, the program module 310 (for example, the program 140) may include an Operating System (OS) for controlling resources related to the electronic device (for example, the electronic device 101) and/or various applications (for example, the application programs 147) executed in the operating system. The operating system may be, for example, Android, iOS, Windows, Symbian, Tizen, Bada, or the like.

The program module 310 may include a kernel 320, middleware 330, an API 360, and/or an application 370. At least some of the program module 310 may be preloaded on the electronic apparatus, or may be downloaded from an external electronic apparatus (e.g., the external electronic device 102 or 104, or the server 106).

The kernel 320 (e.g., the kernel 141) may include, for example, a system resource manager 321 and/or a device driver 323. The system resource manager 321 may perform the control, allocation, retrieval, or the like of system resources. According to an embodiment of the present disclosure, the system resource manager 321 may include a process manager, a memory manager, a file system manager, or the like. The device driver 323 may include, for example, a display driver, a camera driver, a Bluetooth driver, a shared memory driver, a USB driver, a keypad driver, a Wi-Fi driver, an audio driver, or an Inter-Process Communication (IPC) driver.

The middleware 330 may provide a function required by the applications 370 in common or provide various functions to the applications 370 through the API 360 so that the applications 370 can efficiently use limited system resources within the electronic device. According to an embodiment, the middleware 330 (for example, the middleware 143) may include, for example, at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include a library module that a compiler uses in order to add a new function through a programming language while the applications 370 are being executed. The runtime library 335 may perform input/output management, memory management, the functionality for an arithmetic function, or the like.

The application manager 341 may manage, for example, the life cycle of at least one of the applications 370. The window manager 342 may manage Graphical User Interface (GUI) resources used for the screen. The multimedia manager 343 may determine a format required to reproduce various media files, and may encode or decode a media file by using a coder/decoder (codec) appropriate for the relevant format. The resource manager 344 may manage resources, such as a source code, a memory, a storage space, and the like of at least one of the applications 370.

The power manager 345 may operate together with a Basic Input/Output System (BIOS) to manage a battery or power and may provide power information required for the operation of the electronic device. The database manager 346 may generate, search for, and/or change a database to be used by at least one of the applications 370. The package manager 347 may manage the installation or update of an application distributed in the form of a package file.

The connectivity manager 348 may manage a wireless connection such as, for example, Wi-Fi or Bluetooth. The notification manager 349 may display or notify of an event, such as an arrival message, an appointment, a proximity notification, and the like, in such a manner as not to disturb the user. The location manager 350 may manage location information of the electronic apparatus. The graphic manager 351 may manage a graphic effect, which is to be provided to the user, or a user interface related to the graphic effect. The security manager 352 may provide various security functions required for system security, user authentication, and the like. According to an embodiment of the present disclosure, when the electronic apparatus (e.g., the electronic device 101) has a telephone call function, the middleware 330 may further include a telephony manager for managing a voice call function or a video call function of the electronic apparatus.

The middleware 330 may include a middleware module that forms a combination of various functions of the above-described elements. The middleware 330 may provide a module specialized for each type of OS in order to provide a differentiated function. Also, the middleware 330 may dynamically delete some of the existing elements, or may add new elements.

The API 360 (e.g., the API 145) is, for example, a set of API programming functions, and may be provided with a different configuration according to an OS. For example, in the case of Android or iOS, one API set may be provided for each platform. In the case of Tizen, two or more API sets may be provided for each platform.

The applications 370 (for example, the application program 147) may include, for example, one or more applications which can provide functions such as home 371, dialer 372, SMS/MMS 373, Instant Message (IM) 374, browser 375, camera 376, alarm 377, contacts 378, voice dialer 379, email 380, calendar 381, media player 382, album 383, clock 384, health care (for example, measure exercise quantity or blood sugar), or environment information (for example, atmospheric pressure, humidity, or temperature information).

According to an embodiment of the present disclosure, the applications 370 may include an application (hereinafter, referred to as an "information exchange application" for convenience of description) supporting information exchange between the electronic apparatus (e.g., the electronic device 101) and an external electronic apparatus (e.g., the external electronic device 102 or 104). The application associated with information exchange may include, for example, a notification relay application for forwarding specific information to an external electronic device, or a device management application for managing an external electronic device.

For example, the notification relay application may include a function of delivering, to the external electronic apparatus (e.g., the external electronic device 102 or 104), notification information generated by other applications (e.g., an SMS/MMS application, an email application, a health care application, an environmental information application, etc.) of the electronic device 101. Further, the notification relay application may receive notification information from, for example, an external electronic device and provide the received notification information to a user.

The device management application may manage (for example, install, delete, or update), for example, a function for at least a part of the external electronic device (for example, the external electronic device 102 or 104) communicating with the electronic device (for example, turning on/off the external electronic device itself (or some elements thereof) or adjusting brightness (or resolution) of a display), applications executed in the external electronic device, or services provided from the external electronic device (for example, a telephone call service or a message service).

According to an embodiment, the applications 370 may include applications (for example, a health care application of a mobile medical appliance or the like) designated according to attributes of the external electronic device 102 or 104. According to an embodiment of the present disclosure, the application 370 may include an application received from the external electronic apparatus (e.g., the server 106, or the external electronic device 102 or 104). According to an embodiment of the present disclosure, the application 370 may include a preloaded application or a third party application which can be downloaded from the server. Names of the elements of the program module 310, according to the above-described embodiments of the present disclosure, may change depending on the type of OS.

According to various embodiments of the present disclosure, at least some of the program module 310 may be implemented in software, firmware, hardware, or a combination of two or more thereof. At least some of the program module 310 may be implemented (e.g., executed) by, for example, the processor (e.g., the processor 210). At least some of the program module 310 may include, for example, a module, a program, a routine, a set of instructions, and/or a process for performing one or more functions.

The term "module" or "unit" as used herein may, for example, mean a unit including one of hardware, software, and firmware or a combination of two or more of them. The terms "module" and/or "unit" may be interchangeably used with, for example, the term "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an Application-Specific Integrated Circuit (ASIC) chip, a Field-Programmable Gate Arrays (FPGA), and a programmable-logic device for performing operations which has been known or are to be developed hereinafter.

The module or the program module, according to various embodiments, may: include one or more elements described above; exclude some of them; or further include other elements. The operations performed by the module, the program module, or other elements, according to various embodiments, may be executed in a sequential, parallel, iterative, or heuristic method. In addition, some operations may be executed in a different order, or may be omitted, or other operations may be added. In addition, the embodiments disclosed in the present document are intended for the explanation and understanding of the technical matter, and shall not limit the scope of the technology described in the present document. Accordingly, the scope of the present disclosure should be construed to encompass all modifications or various other embodiments based on the technical concept of the present disclosure.

In addition, the embodiments disclosed in the present document are intended for the explanation and understanding of the disclosed technical matter, and shall not limit the scope of various embodiments of the present document. Therefore, the scope of various embodiments of the present document should be construed to encompass all modifications or various other embodiments based on the technical concept of the various embodiments of the present disclosure.

Figure 4:
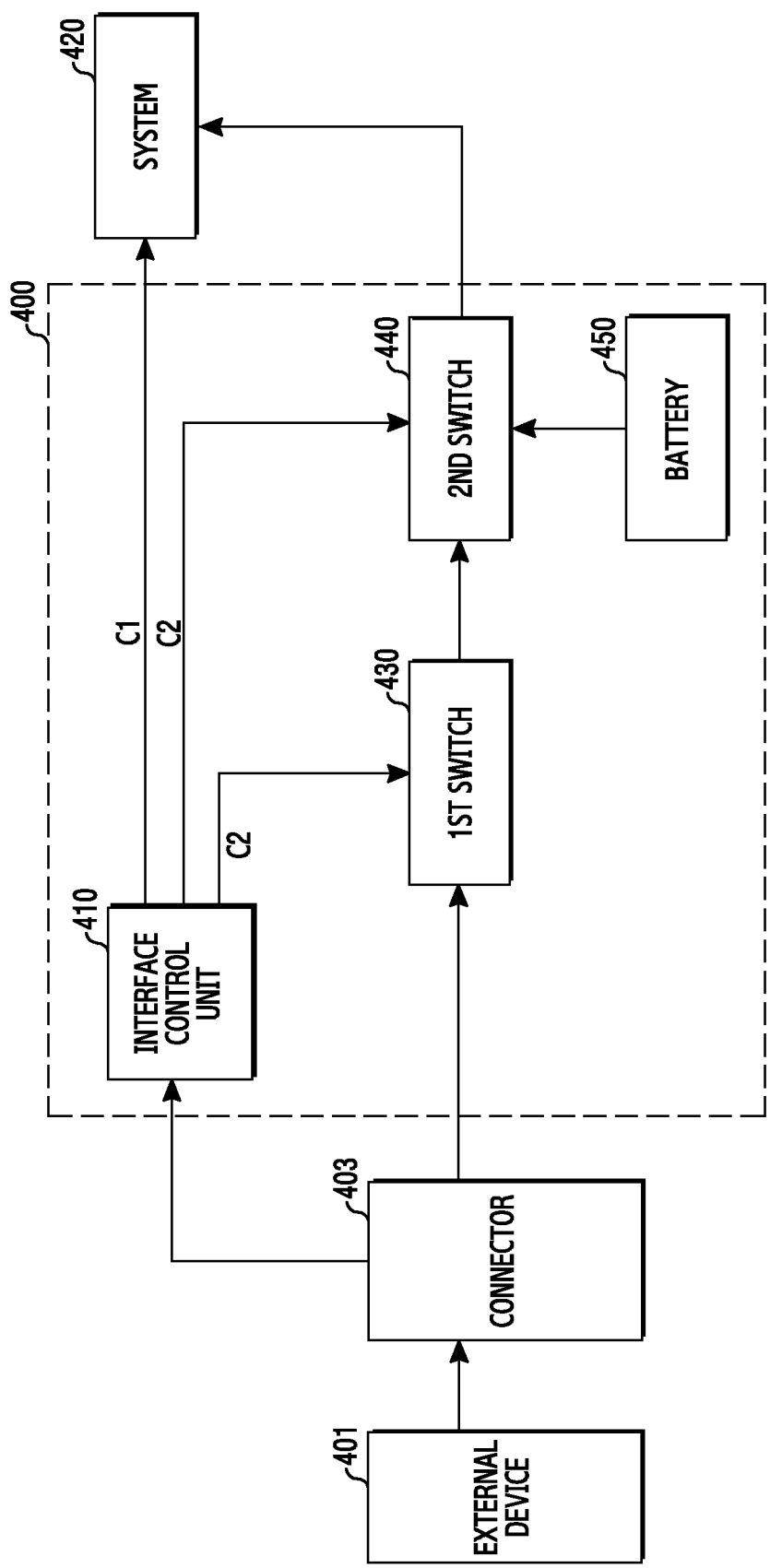
FIG. 4 illustrates a block diagram illustrating an electronic device including a power management module according to one exemplary embodiment of the present disclosure.

FIG. 4 illustrates a block diagram illustrating an electronic device including a power management module according to one exemplary embodiment of the present disclosure. Referring to FIG. 4, in one exemplary embodiment, when a current detecting device (hereinafter, referred to as a 'current detecting device') for measuring a leakage current generated in a system 420 (e.g., a sub-system of the electronic device 101 such as an application processor) during a power-off state is coupled to the electronic device 101, the power management module 400 can control the state of the electronic device 101 for the detection of the leakage current. For example, in case where the current detecting device is coupled to the electronic device 101, the power management module 400 can power off the system 420, and set a path for supplying the system 420 with a current (or a test current) inputted from the current detecting device. In one exemplary embodiment, the power management module 400 may be the same or similar with the power management module 295 of FIG. 2. However, the disclosed invention is not limited to this.

In one exemplary embodiment, the power management module 400 may include an interface control unit 410, a system 420, a 1st switch 430, a 2nd switch 440, a battery 450 and the like.

In one exemplary embodiment, the interface control unit 410 may detect the coupling of an external device 401 to the electronic device 101. For example, if the connector 403 is a USB 3.1 type C connector and the external device 401 supporting the USB 3.1 type C standard is coupled, the interface control unit 410 may detect the coupling of the external device 401 to the electronic device 101, based at least on a $V_{bus}$ signal received from the external device 401. However, a method of detecting the coupling of the external device 401 to the electronic device 101 is not limited to this.

In one exemplary embodiment, the interface control unit 410 may determine the type of the external device 401 coupled to the electronic device 101. For example, if the connector 403 is a USB 3.1 type C connector and the external device 401 supporting the USB 3.1 type C standard is coupled, the interface control unit 410 may determine the type of the external device 401, based at least in part on a Channel Configuration (CC) signal or SideBand Use (SBU) signal received from the external device 401. For example, the interface control unit 410 identifies an IDentification (ID) of the external device 401 included in the CC signal or SBU signal, thereby detects if the external device 401 is, for example, a Travel Adapter (TA) (e.g., a portable alternating current to direct current (AC to DC) adapter), an accessory, a current detecting device, or the like. However, determining the type of the external device 401 is not limited to the aforementioned example.

In another exemplary embodiment, if the connector 403 is a legacy connector and the external device 401 supporting the legacy standard (e.g., the USB 2.0 standard) is coupled, the interface control unit 410 identifies a magnitude of a resistance value (e.g., 50 kΩ) received from the external device 401, and may determine the type of device using this information. However, the method of determining the type of the external device 401 coupled to the electronic device 101 is not limited to the aforementioned example.

In a further exemplary embodiment, in case where a current detecting device is coupled through a jig cable, the interface control unit 410 may determine that the current detecting device is coupled to the electronic device 101, based on an ID or a resistance value received from the current detecting device.

In one exemplary embodiment, the interface control unit 410 may generate a 1st control signal (C1) for turning on or turning off power to the system 420 (i.e., for power on or power off of the system 420) in accordance with the coupling or non-coupling of the external device 401 to the electronic device 101 and the type of the external device 401 coupled to the electronic device 101. For example, when a Travel Adapter (TA) is coupled to the electronic device 101, the interface control unit 410 may generate a 1st control signal (C1) for turning on power of the system 420 (i.e., for power on of the system 420). In another exemplary embodiment, when a current detecting device is coupled to the electronic device 101, the interface control unit 410 may generate a 1st control signal (C1) for turning off the power of the system 420 (i.e., for power off of the system 420). In a further exemplary embodiment, when the electronic device 101 (e.g., the processor 120) receives from a user a power-on input for supplying a power to the electronic device 101, the interface control unit 410 may generate a 1st control signal (C1) for turning on the power of the system 420. In a yet another exemplary embodiment, when the electronic device 101 is not coupled with the external device 401 and the system 420 is currently in a turn off state, the interface control unit 410 may generate a 1st control signal (C1) for maintaining the turn off state of the system 420.

In one exemplary embodiment, the interface control unit 410 may transmit, to the system 420, a 1st control signal (C1) that is generated in accordance with the coupling or non-coupling of the external device 401 to the electronic device 101 and the type of the external device 401 coupled to the electronic device 101.

In one exemplary embodiment, the interface control unit 410 may set a path for forwarding (or transmitting) a power from the external device 401 or the battery 450 to the system 420 in accordance with the coupling or non-coupling of the external device 401 to the electronic device 101 and the type of the external device 401 coupled to the electronic device 101. In setting the path, the interface control unit 410 may generate a 2nd control signal (C2). For example, the interface control unit 410 may generate a 2nd control signal (C2) for controlling switching operations of the 1st switch 430 and the 2nd switch 440, in order to transmit a power, which is inputted from the external device 401 to the connector 403, to the system 420 through the 1st switch 430 and the 2nd switch 440. The interface control unit 410 may close the 1st switch 430 in order to transmit a power, which is inputted from a travel adapter or a current detecting device to the connector 403, to the system 420 through the 1st switch 430 and the 2nd switch 440. To do this, the interface control unit 410 may generate a 2nd control signal (C2) for controlling a switching operation of the 2nd switch 440 such that the 1st switch 430 and the system 420 are coupled with each other through the 2nd switch 440.

In another example, the interface control unit 410 may generate a 2nd control signal (C2) for controlling switching operations of the 1st switch 430 and the 2nd switch 440 so as to transmit a power from the battery 450 to the system 420. For example, in case where the external device 401 is not coupled, the interface control unit 410 may open the 1st switch 430 in order to transmit the power from the battery 450 to the system 420, and generate a 2nd control signal (C2) for controlling a switching operation of the 2nd switch 440 such that the battery 450 and the system 420 are coupled with each other through the 2nd switch 440.

In one exemplary embodiment, the interface control unit 410 may transmit, to the 1st switch 430 and the 2nd switch 440, the 2nd control signal (C2) that is generated in accordance with the coupling or non-coupling of the external device 401 to the electronic device 101 and the type of the external device 401 coupled to the electronic device 101.

In one exemplary embodiment, as in an operation table defined as in [Table 1] below, the interface control unit 410 generates a 1st control signal (C1) and a 2nd control signal (C2), and transmits the generated 1st control signal (C1) and 2nd control signal (C2) to the system 420 and the 1st switch 430 and 2nd switch 440, respectively. Accordingly, the interface control unit 410 is capable of controlling power to the system 420 and switching operations of the 1st switch 430 and the 2nd switch 440.

TABLE 1

| Index | C1 | C2 | Battery coupling | External device coupling | System state |
|---|---|---|---|---|---|
| 01 | High | High | Open | Close | Power-on |
| 02 | High | Low | Close | Open | Power-on |
| 03 | Low | High | Open | Close | Power-off |
| 04 | Low | Low | Close | Open | Power-off |

In one exemplary embodiment, the index 01 may correspond to a mode in which the external device 401 (e.g., travel adapter (TA)) is coupled to the electronic device 101 to supply power to the electronic device 101. In this exemplary embodiment, the interface control unit 410 may generate a 1st control signal (C1) having a high level for turning on a power of the system 420, and transmit the generated 1st control signal (C1) to the system 420. In one exemplary embodiment, the interface control unit 410 may generate a 2nd control signal (C2) having a high level to de-couple the battery 450 from the system 420 (e.g., couple the 1st switch 430 and the system 420 through the 2nd switch 440) and couple the connector 403 and the system 420 (e.g., couple the connector 403 and the 2nd switch 440 through the 1st switch 430), and transmit the generated 2nd control signal (C2) to the 1st switch 430 and the 2nd switch 440. In this exemplary embodiment, in case where the 1st switch 430 receives the 2nd control signal (C2) having the high level, the 1st switch 430 may be closed to couple the connector 403 and the 2nd switch 440. In this exemplary embodiment, in case where the 2nd switch 440 receives the 2nd control signal (C2) having the high level, the 2nd switch 440 may be closed to couple the 1st switch 430 and the system 420. Therefore, when the 1st switch 430 is closed and the 2nd switch 440 is closed to couple the 1st switch 430 and the system 420, power may be supplied from the external device 401 to the system 420.

In this exemplary embodiment, in case where the external device 401 (e.g., the travel adapter (TA)) is coupled to the electronic device 101 to supply power to the electronic device 101, the power inputted from the external device 401 may be also supplied to the battery 450 to charge the battery 450. For example, the electronic device 101 may supply the battery 450 with power from the external device 401 through a VBAT terminal of the connector 403. In another exemplary embodiment, the index 02 may correspond to a mode in which the system 420 is turned on and is supplied with power from the battery 450. In this exemplary embodiment, when the electronic device 101 receives an external input (e.g., a button push for powering-on) for turning on a power of the electronic device 101 when the external device 401 is not coupled to the electronic device 101, the system 420 of the electronic device 101 may turn on. In this exemplary embodiment, the interface control unit 410 may generate a 1st control signal (C1) and a 2nd control signal (C2) that correspond to the mode in which the system 420 is supplied with power from the battery 450 so that the system 420 is turned on. For example, the interface control unit 410 may generate a 1st control signal (C1) having a high level for turning on the power to the system 420, and transmit the generated 1st control signal (C1) to the system 420. If the system 420 receives the 1st control signal (C1) having the high level, the system 420 may turn on (or remain turned on). In this exemplary embodiment, the interface control unit 410 may generate a 2nd control signal (C2) having a low level to couple the battery 450 and the system 420 (e.g., couple the battery 450 and the system 420 through the 2nd switch 440) and de-couple the connector 403 and the system 420 (e.g., de-couple the connector 403 and the 2nd switch 440 by opening the 1st switch 430), and transmit the generated 2nd control signal (C2) to the 1st switch 430 and the 2nd switch 440. In this exemplary embodiment, when the 1st switch 430 receives the 2nd control signal (C2) having the low level, the 1st switch 430 may be opened (or maintain an open state) to release the coupling between the connector 403 and the 2nd switch 440. In this exemplary embodiment, when the 2nd switch 440 receives the 2nd control signal (C2) having the low level, the 2nd switch 440 may perform a switching operation to couple the battery 450 and the system 420. In this exemplary embodiment, the 1st switch 430 is opened and the 2nd switch 440 couples the battery 450 and the system 420, so that power may be supplied from the battery 450 to the system 420.

In another exemplary embodiment, the index 03 may correspond to a mode of measuring a current (i.e., a leakage current) that is consumed by the system 420 when a current detecting device is coupled to the electronic device 101 and power to the system 420 is turned-off. In this exemplary embodiment, in case of the index 03, the interface control unit 410 may generate a 1st control signal (C1) having a low level for turning off the system 420, and transmit the generated 1st control signal (C1) to the system 420. In one exemplary embodiment, the interface control unit 410 may generate a 2nd control signal (C2) having a high level to de-couple the battery 450 from the system 420 and couple the connector 403 and the system 420 (e.g., couple the connector 403 and the 2nd switch 440 through the 1st switch 430), and transmit the generated 2nd control signal (C2) to the 1st switch 430 and the 2nd switch 440. In this exemplary embodiment, when the 1st switch 430 receives the 2nd control signal (C2) having the high level, the 1st switch 430 may be closed to couple the connector 403 and the 2nd switch 440. In one exemplary embodiment, when the 2nd switch 440 receives the 2nd control signal (C2) having the high level, the 2nd switch 440 may couple the 1st switch 430 and the system 420. In this exemplary embodiment, the 1st switch 430 is closed, and the 2nd switch 440 couples the 1st switch 430 and the system 420, so that power may be supplied from the external device 401 to the system 420. For example, if a current for measuring a leakage current of the system 420 is inputted from a current detecting device to the connector 403, the inputted current may be supplied to the system 420 through the 1st switch 430 and the 2nd switch 440.

In another exemplary embodiment, the index 04 may be a mode corresponding to a case where the external device 401 is not coupled to the electronic device 101 and the electronic device 101 is in a power-off state. In one exemplary embodiment, in case where the external device 401 is not coupled to the electronic device 101 and the electronic device 101 is in the power-off state, the interface control unit 410 may generate a 1st control signal (C1) having a low level for turning off the system 420 (or for keeping the system 420 turned off), and a 2nd control signal (C2) for coupling the battery 450 and the system 420 (or maintain the coupling) by using the 2nd switch 440, and opening the 1st switch 430 to de-couple the connector 403 and the 2nd switch 440. In this exemplary embodiment, the interface control unit 410 may transmit the 1st control signal (C1) having the low level to the system 420, and transmit the 2nd control signal (C2) having the low level to the 1st switch 430 and the 2nd switch 440.

In one exemplary embodiment, the operation table, Table 1, describes that, if the system 420 receives a 1st control signal (C1) having a high level, the system 420 turns on the system 420 and, if the system 420 receives a 1st control signal (C1) having a low level, the system 420 turns off the system 420. However, the disclosed invention is not limited to this. For example, the system 420 (or a switch included in the system 420) may be implemented to turn on the system 420 if the system 420 receives the 1st control signal (C1) having the low level, and turn off the system 420 if the system 420 receives the 1st control signal (C1) having the high level.

In one exemplary embodiment, the operation table, Table 1, describes that, if the 1st switch 430 and the 2nd switch 440 receive 2nd control signals (C2) having high levels, the 1st switch 430 is closed and the 2nd switch 440 operates to couple the 1st switch 430 and the system 420 and, if the 1st switch 430 and the 2nd switch 440 receive 2nd control signals (C2) having low levels, the 1st switch 430 is opened and the 2nd switch 440 operates to couple the battery 450 and the system 420. However, the disclosed invention is not limited to this. For example, a signal level controlling a switching operation of a switch may be different in accordance with whether the switch is implemented as an N-channel Metal Oxide Semiconductor (NMOS) or a P-channel Metal Oxide Semiconductor (PMOS).

In one exemplary embodiment, the system 420 may receive a 1st control signal (C1) from the interface control unit 410, and perform a power turn-on or turn-off operation in accordance with the received 1st control signal (C1). In one exemplary embodiment, the system 420 may be supplied with power from the battery 450 or the external device 401 (e.g., a travel adapter, a current detecting device, etc.). In one exemplary embodiment, the system 420 may include various components of the electronic device 101 as well as an application processor (AP). In one exemplary embodiment, the system 420 may include an AP PMIC as a module for managing power within the application processor. However, the disclosed invention is not limited to this.

In one exemplary embodiment, in case where the 1st switch 430 receives a 2nd control signal (C2) from the interface control unit 410, the 1st switch 430 may perform a switching operation in accordance with a level of the received 2nd control signal (C2). For example, in case where the 1st switch 430 receives a 2nd control signal (C2) having a high level, the 1st switch 430 may be closed to couple the connector 403 and the 2nd switch 440. In another example, in case where the 1st switch 430 receives a 2nd control signal (C2) having a low level, the 1st switch 430 may be opened to de-couple the connector 403 from the 2nd switch 440.

In one exemplary embodiment, the 1st switch 430 may be included in an Interface Power Management Integrated Circuit (IF PMIC). In another exemplary embodiment, the 1st switch 430 may be the IF PMIC. In one exemplary embodiment, when power is supplied from the external device 401, the IF PMIC may determine whether to supply the power to the system 420 or whether to supply the power to the battery 450 to charge the battery 450. However, the disclosed invention is not limited to this.

In one exemplary embodiment, when the 2nd switch 440 receives a 2nd control signal (C2) from the interface control unit 410, the 2nd switch 440 may perform a switching operation in accordance with a level of the received 2nd control signal (C2). For example, in case where the 2nd switch 440 receives a 2nd control signal (C2) having a high level, the 2nd switch 440 may couple the 1st switch 430 and the system 420. In another example, in case where the 2nd switch 440 receives a 2nd control signal (C2) having a low level, the 2nd switch 440 may couple the system 420 and the battery 450.

In one exemplary embodiment, the 2nd switch 440 may be included in an IF PMIC. In another exemplary embodiment, the 1st switch 430 may be the PMIC. However, the disclosed invention is not limited to this.

In one exemplary embodiment, the 1st switch 430 and the 2nd switch 440 may be implemented as one integrated switch. In one exemplary embodiment, in case where the 1st switch 430 and the 2nd switch 440 are implemented as one integrated switch, the integrated switch may perform a switching operation between the external device 401 or the battery 450 in accordance with a 2nd control signal (C2) received from the interface control unit 410.

In one exemplary embodiment, the 1st switch 430 and the 2nd switch 440 may consist of a Field Effect Transistor (FET), a Bipolar Junction Transistor (BJT), a diode, or a combination thereof. However, the disclosed invention is not limited to this.

In one exemplary embodiment, the battery 450 may supply power to the system 420 in accordance with a control signal (e.g., 2nd control signal (C2)) or a setting of the electronic device 101. In another exemplary embodiment, the battery 450 receives power from the external device 401, thereby performs a charging operation. However, he disclosed invention is not limited to this.

In one exemplary embodiment, the battery 450 may include an inner battery that is integrally combined (or assembled) within a housing of the electronic device 101. However, he disclosed invention is not limited to this.

In one exemplary embodiment, if power or a data signal (or a control signal, etc.) is inputted from the external device 401, the connector 403 may transmit the inputted power or data signal to corresponding component of the electronic device 101. For example, in case where the external device 401 is coupled, the connector 403 may transmit ID information of the external device 401 to the interface control unit 410. In another example, in case where the external device 401 is coupled, the connector 403 may transmit power supplied from the external device 401 to the components of the electronic device 101 requiring power.

In one exemplary embodiment, the connector 403 may support various communication standards. For example, the connector 403 may support the legacy standard (e.g., USB 2.0 standard) as well as the USB 3.1 type C standard. In another exemplary embodiment, the connector 403 may be implemented in various forms so as to support various communication standards. For example, the connector 403 may include a slot of another form and pins of a different number in accordance with a supported communication standard.

Figure 5:
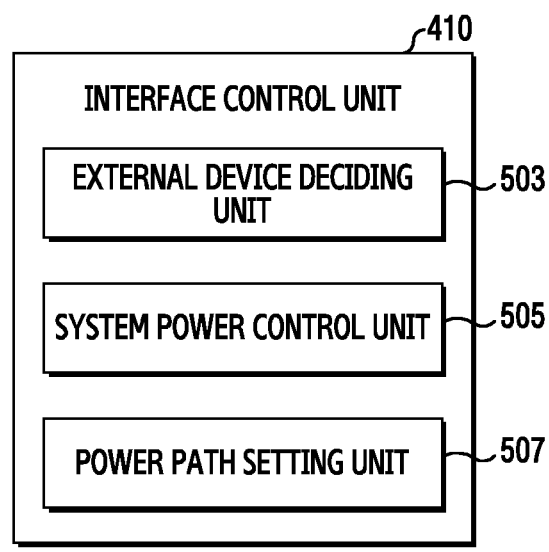
FIG. 5 illustrates a block diagram illustrating an interface control unit of a power management module according to one exemplary embodiment of the present disclosure.

FIG. 5 illustrates a block diagram illustrating an interface control unit of a power management module according to one exemplary embodiment of the present disclosure.

Referring to FIG. 5, the power management module 400 may include an external device deciding unit 503, a system power control unit 505, a power path setting unit 507 and the like.

In one exemplary embodiment, the external device deciding unit 503 may detect the coupling of the external device 401 to the electronic device 101. When the external device 401 is coupled to the electronic device 101, the external device deciding unit 503 may determine the type of the external device 401. For example, when the external device 401 is coupled to the electronic device 101, the external device deciding unit 503 may determine the type of the external device 401 based on at least one of a resistance value received from the external device 401 and an ID of the external device 401. However, the disclosed invention is not limited to this.

In one exemplary embodiment, the system power control unit 505 may generate a control signal for turning on or turning off the system 420 (or for turning on or turning off power of the system 42) in accordance with the type of the external device 401. For example, when the external device 401 is a current detecting device, the system power control unit 505 may generate a control signal for turning off the system 420 (or keeping the system 420 turned off) as a precondition for detecting a leakage current. In another example, when the external device 401 is an external device 401 (e.g., travel adapter) available for power supplying, the system power control unit 505 may generate a control signal for turning on the system 420.

In one exemplary embodiment, the power path setting unit 507 may determine a path to supply power to the system 420 in accordance with the coupling or non-coupling of the external device 401 and the like. For example, in case where the external device 401 is coupled, the power path setting unit 507 may control a switching operation of at least one switch in order to set a path for supplying the system 420 with power from the external device 401.

In one exemplary embodiment, it is illustrated that the external device deciding unit 503, the system power control unit 505, and the power path setting unit 507 are included in the interface control unit 410. However, the disclosed invention is not limited to this. For example, at least one of the external device deciding unit 503, the system power control unit 505, and the power path setting unit 507 may be implemented as a component of the electronic device 101 independent of the interface control unit 410, or be implemented in the form of being included within another module other than the interface control unit 410.

An electronic device according to various exemplary embodiments of the present disclosure may include one or more switches, one of more sub-systems, and an interface control unit electrically coupled with the one or more sub-systems and the one or more switches. The interface control unit is configured to: detect a coupling of an external device to the electronic device, identify a type of the coupled external device, when the external device is identified as a current detecting device, generate a first control signal for turning off power to the one or more sub-systems, and a second control signal for setting a first path to supply the one or more sub-systems with power from the current detecting device, and transmit the first control signal to the one or more sub-systems and the second control signal to the one or more switches.

In one exemplary embodiment, the first path may include a path coupling a connector of the electronic device to the one or more sub-systems via the one or more switches.

In one exemplary embodiment, the switch may include a first switch and a second switch, and when the second control signal for setting the first path is received by the one or more switches, the first switch couples the connector of the electronic device to the second switch, and the second switch couples the first switch to the one or more sub-systems.

In one exemplary embodiment, the first switch and/or the second switch may be included in an Interface Power Management Integrated Circuit (IF PMIC) or a Power Management Integrated Circuit (PMIC).

In one exemplary embodiment, the switch may include one integrated switch, and when the second control signal for setting the first path is received by the one integrated switch, the one integrated switch couples a connector of the electronic device to the one or more sub-systems.

In one exemplary embodiment, the interface control unit may be included in a Channel Configuration Integrated Circuit (CC IC).

In one exemplary embodiment, the current detecting device may measure a leakage current generated in the one or more sub-systems, based at least on the power supplied by the current detecting device to the one or more sub-systems, and may determine the electronic device as faulty when the measured leakage current is equal to or is greater than a designated threshold value.

In one exemplary embodiment, when the type of the detected external device is a travel adapter, the interface control unit may be configured to generate a third control signal for turning on the power to the one or more sub-systems, and a fourth control signal for setting the first path to supply the one or more sub-systems with the power from the travel adapter, and transmit the third control signal to the one or more sub-systems and the fourth control signal to the one or more switches.

In one exemplary embodiment, when the electronic device receives an input for powering on the electronic device and the external device is not coupled to the electronic device, the interface control unit may be configured to generate a third control signal for turning on the power to the one or more sub-systems, and a fourth control signal for setting a second path to supply power from a battery to the one or more sub-systems, and transmit the third control signal to the one or more sub-systems and the fourth control signal to the one or more switches.

Figure 6:
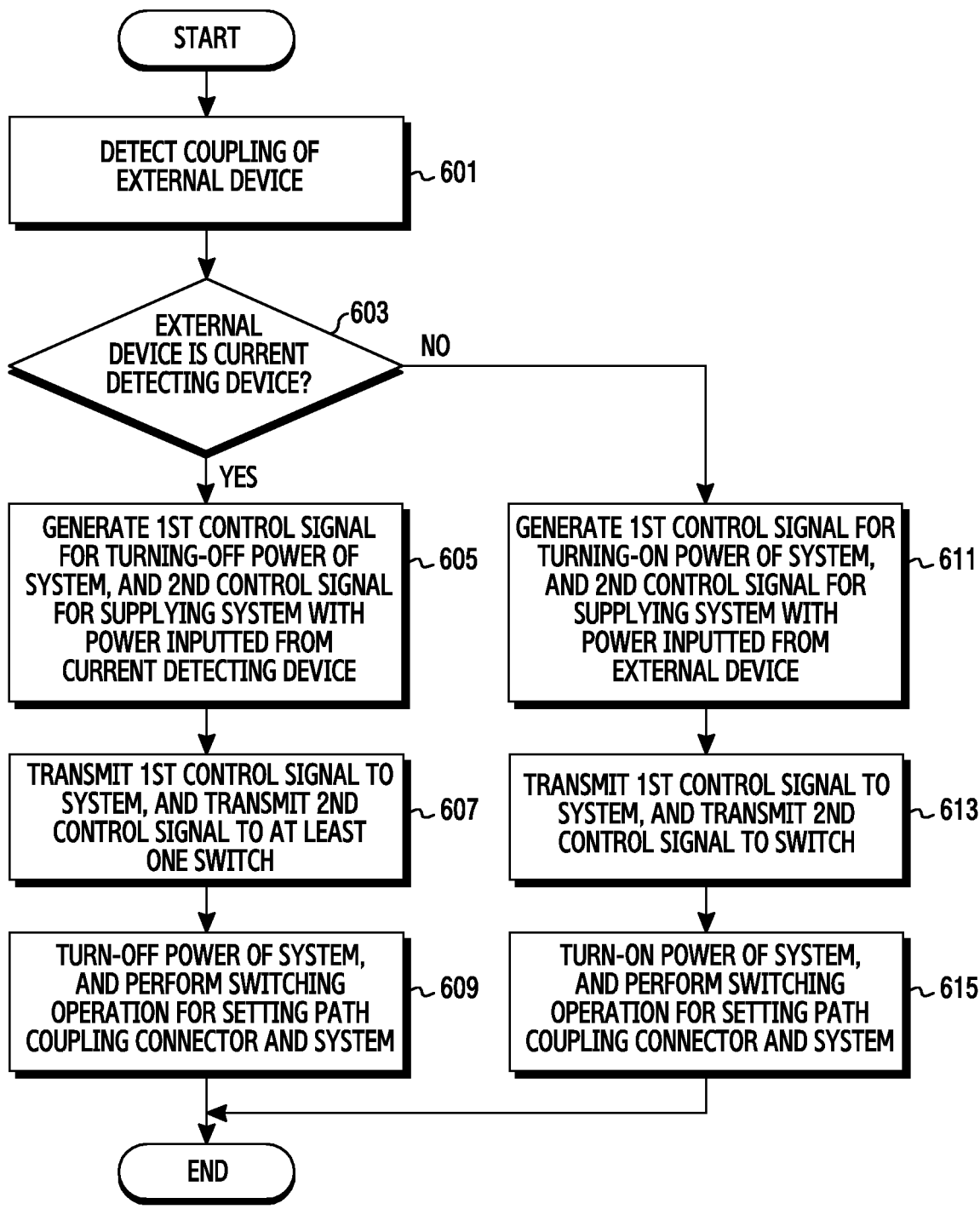
FIG. 6 is a flowchart illustrating a method for measuring a leakage current according to one exemplary embodiment of the present disclosure.

In one exemplary embodiment, a battery included in the electronic device may be integrated within a housing of the electronic device. FIG. 6 is a flowchart illustrating a method for measuring a leakage current according to one exemplary embodiment of the present disclosure.

Referring to FIG. 6, in operation 601, the interface control unit 410 may detect the coupling of the external device 401 to the electronic device 101. For example, in case where the external device 401 supporting the USB 3.1 type C standard is coupled, the interface control unit 410 may detect the coupling of the external device 401 to the electronic device 101, for example, based at least on a $V_{bus}$ signal received from the external device 401. However, the method of detecting the coupling of the external device 401 to the electronic device 101 is not limited to this.

In operation 603, the interface control unit 410 may determine the type of the external device 401 that is coupled to the electronic device 101. For example, in case where the external device 401 supporting the USB 3.1 type C standard is coupled, the interface control unit 410 may determine the type of the external device 401 based on a Channel Configuration (CC) signal or SideBand Use (SBU) signal received from the external device 401. For example, the interface control unit 410 may identify an IDentification (ID) of the external device 401 included in the CC signal or SBU signal, thereby detecting if the external device 401 is, for example, a Travel Adapter (TA), an accessory, a current detecting device, or the like. However, the method of determining the type of the external device 401 determined by identifying the ID is not limited to this.

In another exemplary embodiment, in case where the external device 401 supporting the legacy standard (e.g., USB 2.0 standard) is coupled, the interface control unit 410 may identify a magnitude of a resistance value (e.g., 50 kΩ) received from the external device 401, thereby detecting the type of the external device 401 coupled with the electronic device 101. However, the method of determining the type of the external device 401 coupled to the electronic device 101 is not limited to the aforementioned example.

In another exemplary embodiment, when the current detecting device is coupled through a jig cable, the interface control unit 410 may determine that the current detecting device is coupled to the electronic device 101, based on an ID or a resistance value received from the current detecting device.

In operation 605, when it is determined in operation 603 that the external device 401 coupled to the electronic device 101 is the current detecting device, the interface control unit 410 may generate a 1st control signal (C1) for turning off the system 420, and a 2nd control signal (C2) for supplying the system 420 with power inputted from the current detecting device. In one exemplary embodiment, the interface control unit 410 may generate a 1st control signal (C1) having a low level for turning off the system 200.

In one exemplary embodiment, the interface control unit 410 may generate a 2nd control signal (C2) having a high level to de-couple the battery 450 and the system 420 (e.g., couple the 1st switch 430 and the system 420 through the 2nd switch 440) and couple the connector 403 and the system 420 (e.g., couple the connector 403 and the 2nd switch 440 through the 1st switch 430).

In operation 607, the interface control unit 410 may transmit the generated 1st control signal (C1) to the system 420, and transmit the 2nd control signal (C2) to the 1st switch 430 and the 2nd switch 440.

In operation 609, the system 420 may turn off its power (or keep the power turned off), based on the received 1st control signal (C1), and the 1st switch 430 and the 2nd switch 440 may perform a switching operation for forming a path to supply power inputted from the current detecting device, from the connector 403, to the system 420.

In one exemplary embodiment, when the 1st switch 430 receives a 2nd control signal (C2) having a high level, the 1st switch 430 may be closed to couple the connector 403 and the 2nd switch 440. In one exemplary embodiment, when the 2nd switch 440 receives a 2nd control signal (C2) having a high level, the 2nd switch 440 may perform a switching operation for coupling the 1st switch 430 and the system 420. In one exemplary embodiment, when the 1st switch 430 is closed, and the 2nd switch 440 couples the 1st switch 430 and the system 420, power may be supplied from the current detecting device to the system 420. For example, if a current for measuring a leakage current of the system 420 is inputted from the current detecting device to the connector 403, the inputted current may be supplied to the system 420 through the 1st switch 430 and the 2nd switch 440.

In one exemplary embodiment, although not illustrated in FIG. 6, when the system 420 is turned off, and when the current detecting device applies its power (or current) to the electronic device 101, a leakage current generated in the system 420 may be measured by the current detecting device. In one exemplary embodiment, when the measured current is equal to or is greater than a threshold value (e.g., 100 mA), the current detecting device may determine that the electronic device 101 (e.g., system 420) is faulty. However, the disclosed invention is not limited to this.

In operation 611, when it is detected in operation 603 that the external device 401 coupled to the electronic device 101 is an external device 401 that can supply power, the interface control unit 410 may generate a 1st control signal (C1) for turning off the power to the system 420 (or keeping the power turned on), and a 2nd control signal (C2) for supplying the system 420 with power inputted from the external device 401.

In one exemplary embodiment, the interface control unit 410 may generate a 1st control signal (C1) having a high level for turning on power to the system 200.

In one exemplary embodiment, the interface control unit 410 may generate a 2nd control signal (C2) having a high level to de-couple the battery 450 and the system 420 (e.g., couple the 1st switch 430 and the system 420 through the 2nd switch 440), and couple the connector 403 and the system 420 (e.g., couple the connector 403 and the 2nd switch 440 through the 1st switch 430).

In operation 613, the interface control unit 410 may transmit the generated 1st control signal (C1) to the system 420, and transmit the generated 2nd control signal (C2) to the 1st switch 430 and the 2nd switch 440.

In operation 615, the system 420 may turn on its power (or keep the power on), based on the received 1st control signal (C1), and the 1st switch 430 and the 2nd switch 440 may perform a switching operation in order to form a path for supplying power inputted from the external device 401 to the system 420.

In one exemplary embodiment, when the 1st switch 430 receives a 2nd control signal (C2) having a high level, the 1st switch 430 may be closed to couple the connector 403 and the 2nd switch 440. In one exemplary embodiment, in case where the 2nd switch 440 receives a 2nd control signal (C2) having a high level, the 2nd switch 440 may perform a switching operation for coupling the 1st switch 430 and the system 420. In one exemplary embodiment, when the 1st switch 430 is closed, and the 2nd switch 440 couples the 1st switch 430 and the system 420, power may be supplied to the system 420 from the external device 401.

In one exemplary embodiment, when the external device 401 is coupled to the electronic device 101, power inputted from the external device 401 is also supplied to the battery 450 to effect charging of the battery 450.

In one exemplary embodiment, a level of a control signal may change from a high level to a low level and/or from a low level to a high level, depending on the construction of the switches. For example, FIG. 6 may correspond to a case where the switch is turned-on if a signal having a high level is applied to a gate, such as an NMOS. In another example, in case where the switch is turned-on if a signal having a low level is applied to a gate, such as a PMOS, in FIG. 6, the control signal having the high level may be changed into (or replaced with) a control signal having a low level, and the control signal having the low level may be changed into a control signal having a high level.

In one exemplary embodiment, the 1st switch 430 and the 2nd switch 440 may consist of a Field Effect Transistor (FET), a Bipolar Junction Transistor (BJT), a diode, or a combination thereof. However, the disclosed invention is not limited to this.

In one exemplary embodiment, although not illustrated in FIG. 6, when the external device 401 coupled to the electronic device 101 is an external device (e.g., an accessory such as an earphone, a speaker, a keyboard and the like) that consumes power in operation 603, the interface control unit 410 may generate a 1st control signal (C1) for turning on the system 420. In another example, the interface control unit 410 may generate a 2nd control signal (C2) for opening the 1st switch 430 and coupling the battery 450 and the system 420 through the 2nd switch 440, in order to supply power from the battery 450 to the system 420. However, the disclosed invention is not limited to this.

Figure 7A:
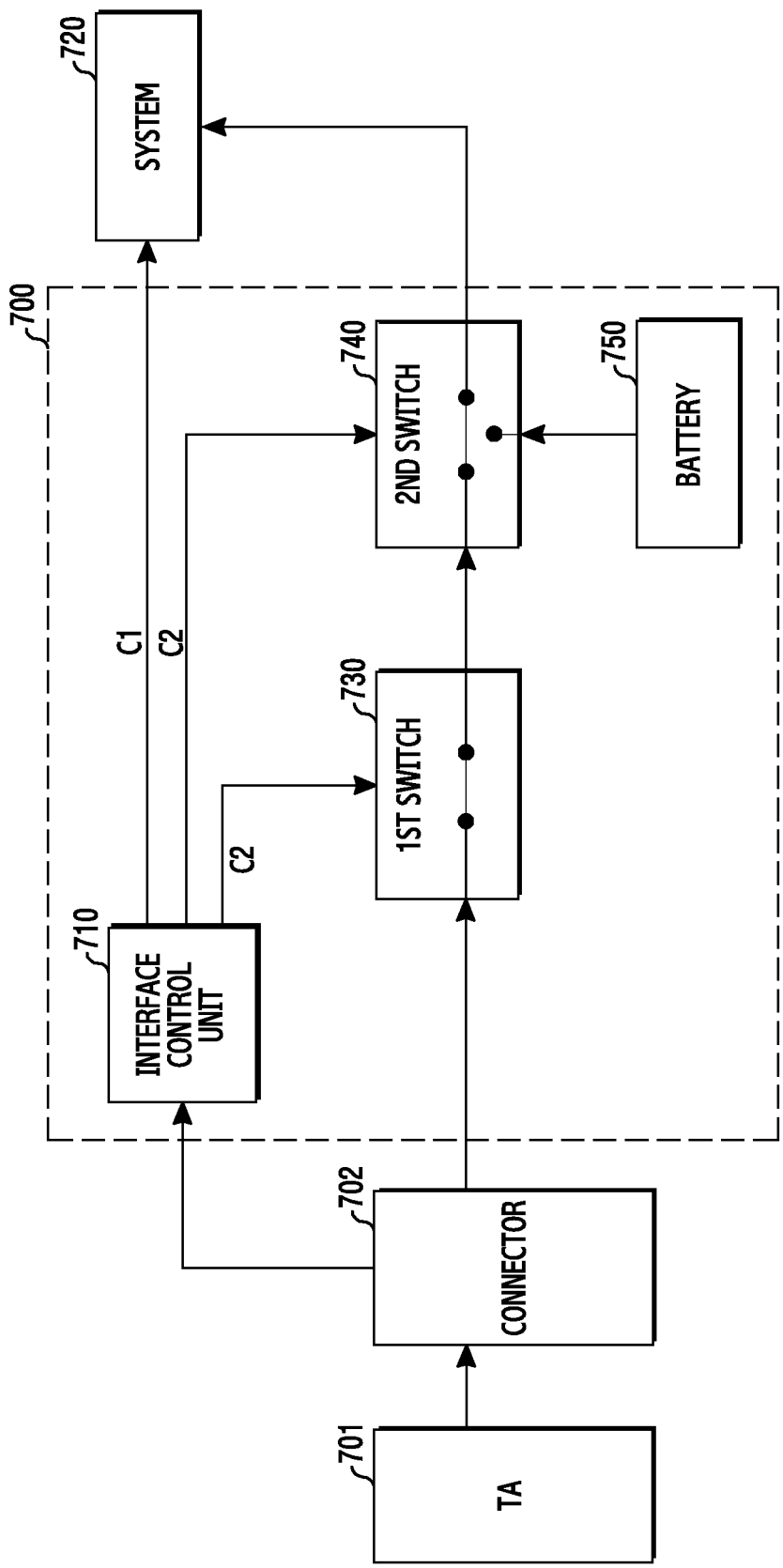
FIG. 7A and FIG. 7B illustrate block diagrams illustrating an electronic device including a power management module according to one exemplary embodiment of the present disclosure.
Figure 7B:
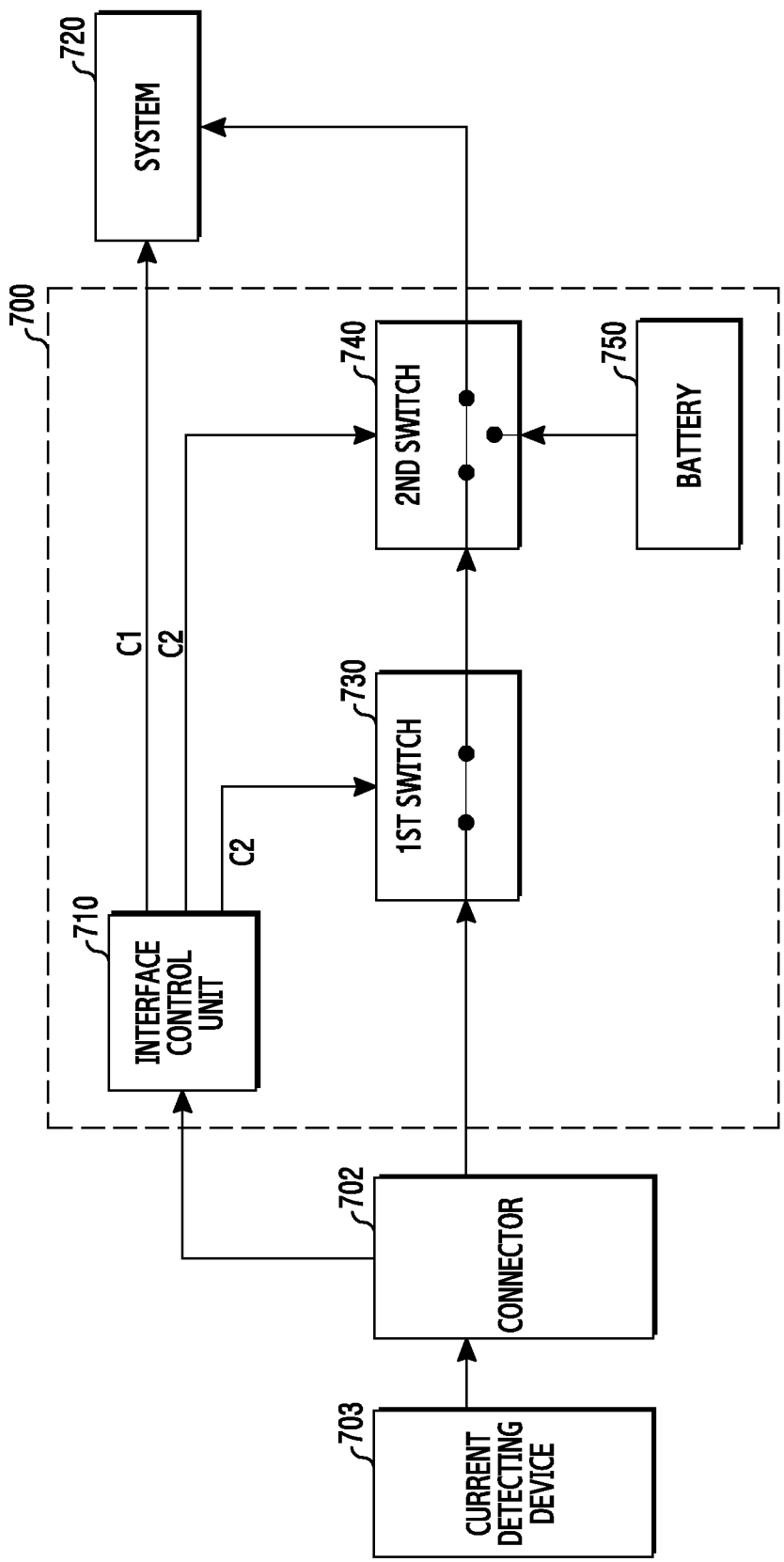

FIG. 7A and FIG. 7B illustrate block diagrams illustrating an electronic device including a power management module according to one exemplary embodiment of the present disclosure.

Referring to FIG. 7A, FIG. 7A may be a figure corresponding to a case where an external device, for example, a travel adapter (TA) available for power supplying to the electronic device 101 is coupled to the electronic device 101. However, the external device available for power supplying to the electronic device 101 is not limited to the travel adapter.

In one exemplary embodiment, the power management module 700 may include an interface control unit 710, a system 720, a 1st switch 730, a 2nd switch 740, a battery 750 and the like.

In one exemplary embodiment, the interface control unit 710 may determine that a travel adapter 701 is coupled to the electronic device 101. For example, the interface control unit 710 may detect that an external device is coupled to the electronic device 101 based at least on voltage information received from the travel adapter 701, and determine that the coupled external device is the travel adapter 701 based at least on a resistance value or ID information received from the travel adapter 701. However, the disclosed invention is not limited to this.

In one exemplary embodiment, the interface control unit 710 may generate a 1st control signal (C1) for turning power of the system 720 on (or for keeping the system 720 turned on), and transmit the generated 1st control signal (C1) to the system 720. In one exemplary embodiment, in case where the system 720 receives the 1st control signal (C1) from the interface control unit 710, the system 720 may turn on.

In one exemplary embodiment, the interface control unit 710 may generate a 2nd control signal (C2) for setting a path for supplying the system 720 with power inputted from the travel adapter 701. The interface control unit 710 may transmit the generated 2nd control signal (C2) to the 1st switch 730 and the 2nd switch 740.

In one exemplary embodiment, if the 1st switch 730 receives a 2nd control signal (C2) from the interface control unit 710, the 1st switch 430 may perform a switching operation for coupling the connector 702 and the 2nd switch 740. For example, the 1st switch 730 may change from an open state to a close state, or maintain the close state.

In one exemplary embodiment, if the 2nd switch 740 receives a 2nd control signal (C2) from the interface control unit 710, the 2nd switch 730 may perform a switching operation for coupling the 1st switch 730 and the system 720. For example, the 2nd switch 740 may be switched to couple the 1st switch 730 and the system 720. In another example, the 2nd switch 740 may maintain a state of coupling the 1st switch 730 and the system 720.

In one exemplary embodiment, as illustrated in FIG. 7A, power inputted from the travel adapter 701 may be supplied to the system 720 through the connector 702, the 1st switch 730 and the 2nd switch 740.

In one exemplary embodiment, although not illustrated in FIG. 7A, the power inputted from the travel adapter 701 is supplied to the battery 750 through the connector 702, the 1st switch 730, and a charging IC (not shown) electrically coupled to the 1st switch 730, so that the battery 750 may be charged by the power from the TA.

Referring to FIG. 7B, FIG. 7B may be a figure corresponding to a case where an external device, for example, a current detecting device measuring a leakage current generated in the electronic device 101 is coupled to the electronic device 101.

In one exemplary embodiment, the power management module 700 may include an interface control unit 710, a system 720, a 1st switch 730, a 2nd switch 740, a battery 750 and the like.

In one exemplary embodiment, the interface control unit 710 may determine that a current detecting device 703 is coupled to the electronic device 101. For example, the interface control unit 710 may detect that an external device is coupled to the electronic device 101 based at least on voltage information received from the current detecting device 703, and determine that the coupled external device is the current detecting device 703 based at least on a resistance value or ID information received from the current detecting device 703. However, the disclosed invention is not limited to this.

In one exemplary embodiment, the interface control unit 710 may generate a 1st control signal (C1) for turning off power of the system 720 (or for keeping the system 720 turned off), and transmit the generated 1st control signal (C1) to the system 720. In one exemplary embodiment, in case where the system 720 receives the 1st control signal (C1) from the interface control unit 710, the system 720 may turn off.

In one exemplary embodiment, the interface control unit 710 may generate a 2nd control signal (C2) for setting a path for supplying the system 720 with power inputted from the current detecting device 703. The interface control unit 710 may transmit the generated 2nd control signal (C2) to the 1st switch 730 and the 2nd switch 740.

In one exemplary embodiment, if the 1st switch 730 receives a 2nd control signal (C2) from the interface control unit 710, the 1st switch 430 may perform a switching operation for coupling the connector 702 and the 2nd switch 740. For example, the 1st switch 730 may change from a open state to a close state, or maintain the close state.

In one exemplary embodiment, if the 2nd switch 740 receives a 2nd control signal (C2) from the interface control unit 710, the 2nd switch 740 may perform a switching operation for coupling the 1st switch 730 and the system 720. For example, the 2nd switch 740 may be switched to couple the 1st switch 730 and the system 720. In another example, the 2nd switch 740 may maintain a state of coupling the 1st switch 730 and the system 720.

In one exemplary embodiment, as illustrated in FIG. 7B, power inputted from the travel adapter may be supplied to the system 720 through the 1st switch 730 and the 2nd switch 740.

In one exemplary embodiment, although not illustrated in FIG. 7B, when which power to the system 720 is turned-off, the current detecting device applies its power (or current) to the electronic device 101, and can measure a leakage current generated in the system 720. In one exemplary embodiment, when the measured current is equal to or is greater than a threshold value (e.g., 100 mA), the current detecting device may determine that the electronic device 101 (e.g., the system 720) is faulty. However, the disclosed invention is not limited to this.

Figure 8:
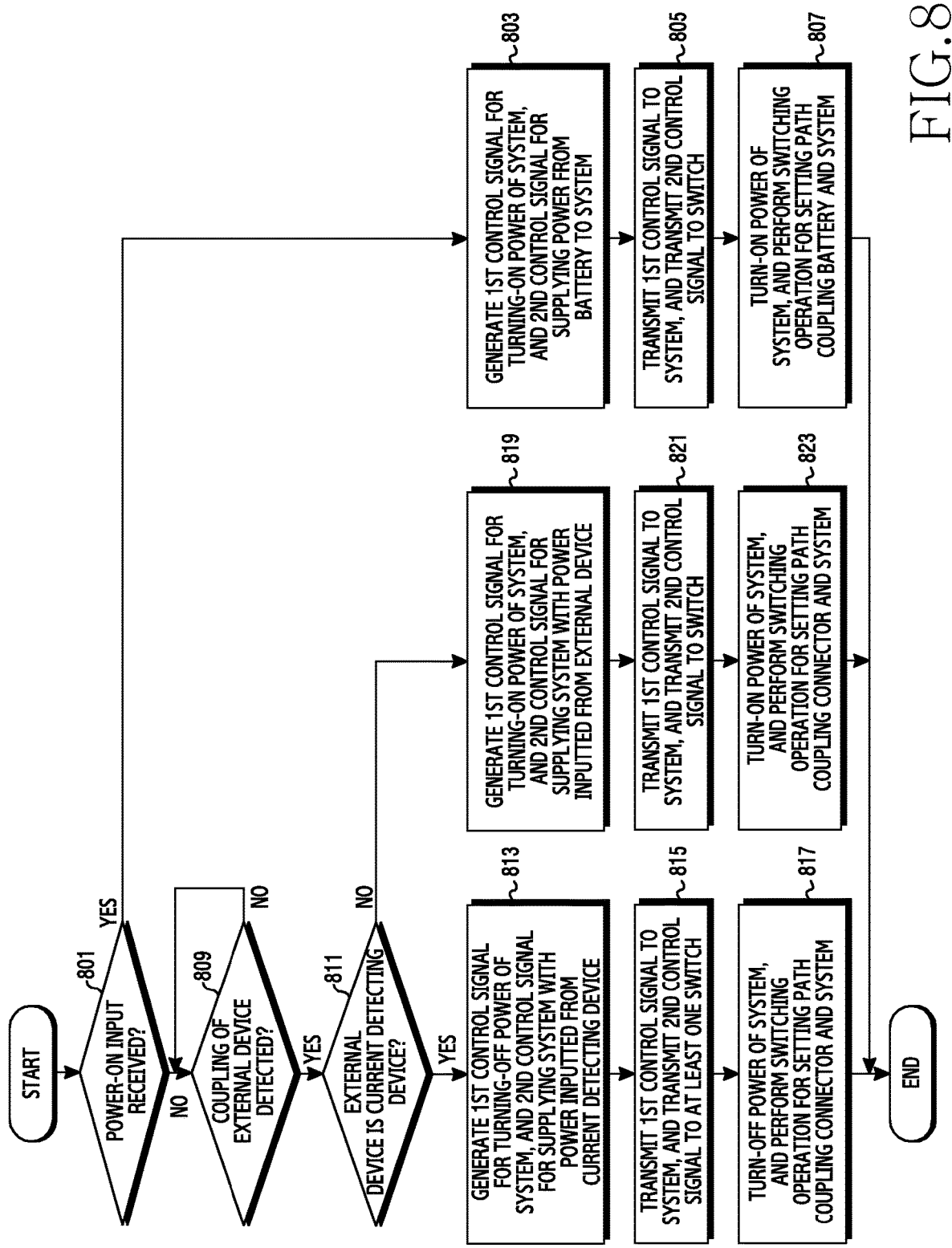
FIG. 8 is a flowchart illustrating a method for measuring a leakage current according to another exemplary embodiment of the present disclosure.

FIG. 8 is a flowchart illustrating a method for measuring a leakage current according to another exemplary embodiment of the present disclosure.

Referring to FIG. 8, in operation 801, the electronic device 101 may determine if an input for powering-on the electronic device 101 is received. For example, the electronic device 101 may determine if an input for powering-on the electronic device 101 is received from a user. However, the disclosed invention is not limited to this.

In operation 803, the interface control unit 410 may generate a 1st control signal (C1) for turning on the power to the system 420 (or keeping the system 420 turned on), and a 2nd control signal (C2) for supplying the system 420 with power inputted from the battery 450.

In one exemplary embodiment, the interface control unit 410 may generate a 1st control signal (C1) having a high level for turning on power to the system 200 (or keep the system 420 turned on). In one exemplary embodiment, the interface control unit 410 may generate a 2nd control signal (C2) having a low level, in order to couple the battery 450 and the system 420.

In operation 805, the interface control unit 410 may transmit the generated 1st control signal (C1) to the system 420, and transmit the generated 2nd control signal (C2) to, for example, the 1st switch 430 and the 2nd switch 440.

In operation 807, the system 420 may turn on, based on the received 1st control signal (C1), and the 1st switch 430 and the 2nd switch 440 may perform a switching operation so as to form a path for supplying the system 420 with power inputted from the battery 450.

In one exemplary embodiment, in case where the 1st switch 430 receives a 2nd control signal (C2) having a low level, the 1st switch 430 may be opened to de-couple the connector 403 and the 2nd switch 440. In one exemplary embodiment, in case where the 2nd switch 440 receives a 2nd control signal (C2) having a low level, the 2nd switch 440 may perform a switching operation for coupling the battery 450 and the system 420. In one exemplary embodiment, when the 1st switch 430 is opened, and the 2nd switch 440 couples the battery 450 and the system 420, power may be supplied from the battery 450 to the system 420.

In operation 809, in case where the power-on input is not received in operation 801, the interface control unit 410 may determine if an external device is coupled to the electronic device 101. For example, the interface control unit 410 may determine if an external device capable of supplying power to the electronic device 101 is coupled to the electronic device 101. In one exemplary embodiment, the interface control unit 410 may make the determination periodically.

The determination of the coupling of the external device to the electronic device 101 in operation 809 is at least partially the same or similar with operation 601 of FIG. 6 and thus, its detailed description is omitted.

In one exemplary embodiment, operation 811 to operation 823 are the at least partially same or are similar with operation 603 to operation 615 of FIG. 6 respectively and thus, their detailed descriptions are omitted.

Figure 9:
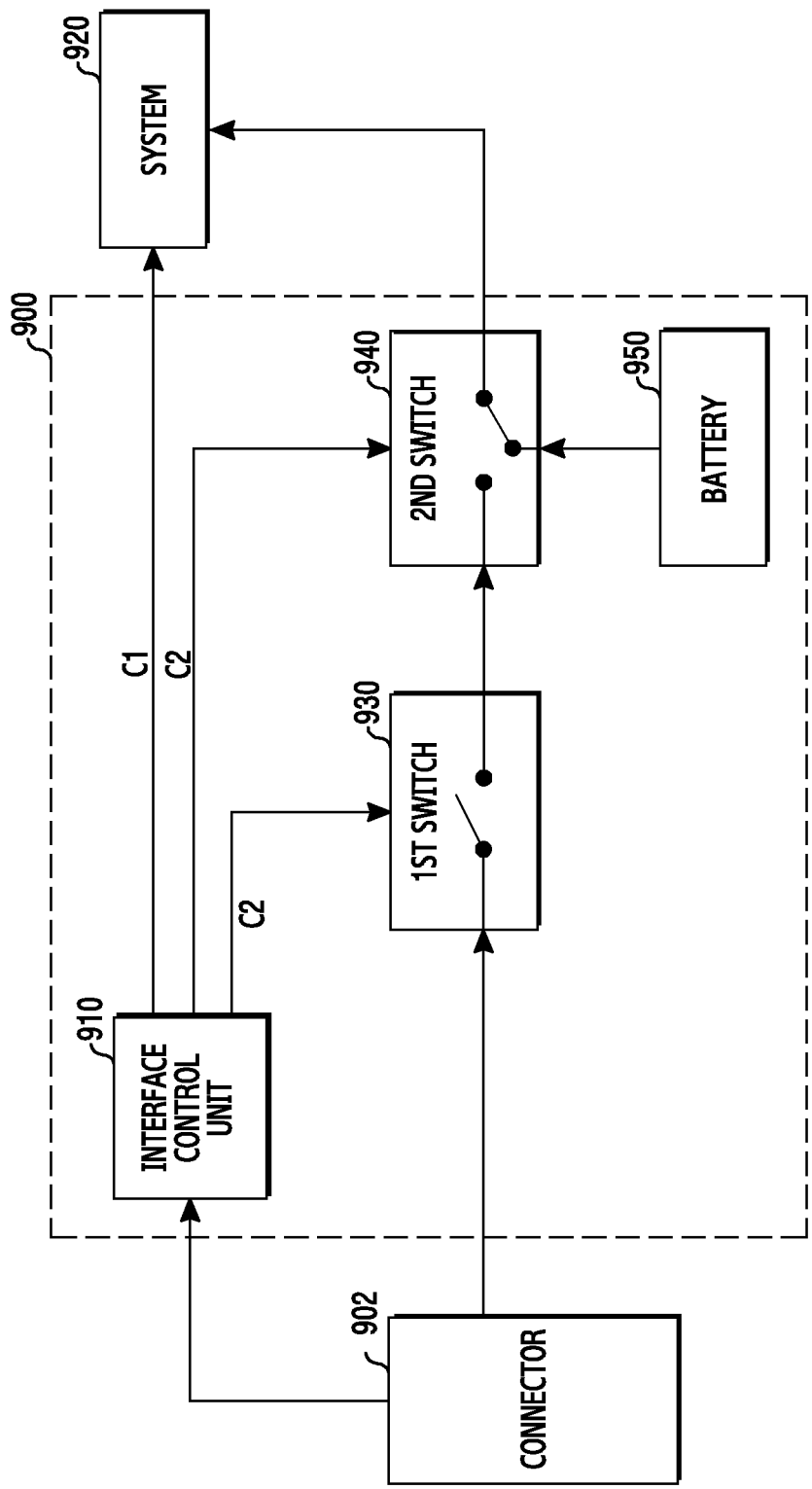
FIG. 9 illustrates a block diagram illustrating an electronic device including a power management module according to another exemplary embodiment of the present disclosure.

FIG. 9 illustrates a block diagram illustrating an electronic device including a power management module according to another exemplary embodiment of the present disclosure.

Referring to FIG. 9, FIG. 9 may be a figure corresponding to a case where an external device available for power supplying is not coupled to the electronic device 101, and the electronic device 101 is in a power-on state.

In one exemplary embodiment, the power management module 900 may include an interface control unit 910, a system 920, a 1st switch 930, a 2nd switch 940, a battery 950 and the like.

In one exemplary embodiment, the interface control unit 910 may generate a 1st control signal (C1) for turning on power to the system 920 (or keeping the system 920 turned on), and transmit the generated 1st control signal (C1) to the system 920. In one exemplary embodiment, in case where the system 920 receives the 1st control signal (C1) from the interface control unit 910, the system 720 may turn on (or remain turned on).

In one exemplary embodiment, the interface control unit 910 may generate a 2nd control signal (C2) for supplying a power from the battery 950 to the system 920. The interface control unit 910 may transmit the generated 2nd control signal (C2) to the 1st switch 930 and the 2nd switch 940.

In one exemplary embodiment, if the 1st switch 930 receives a 2nd control signal (C2) from the interface control unit 910, the 1st switch 930 may perform a switching operation to de-couple the connector 702 and the 2nd switch 940. For example, the 1st switch 930 may change from a close state into an open state, or maintain the open state.

In one exemplary embodiment, if the 2nd switch 940 receives a 2nd control signal (C2) from the interface control unit 910, the 2nd switch 940 may perform a switching operation for coupling the battery 950 and the system 920. For example, the 2nd switch 940 may be switched to couple the battery 950 and the system 920. In another example, the 2nd switch 940 may maintain a state of coupling the battery 950 and the system 920.

Figure 10:
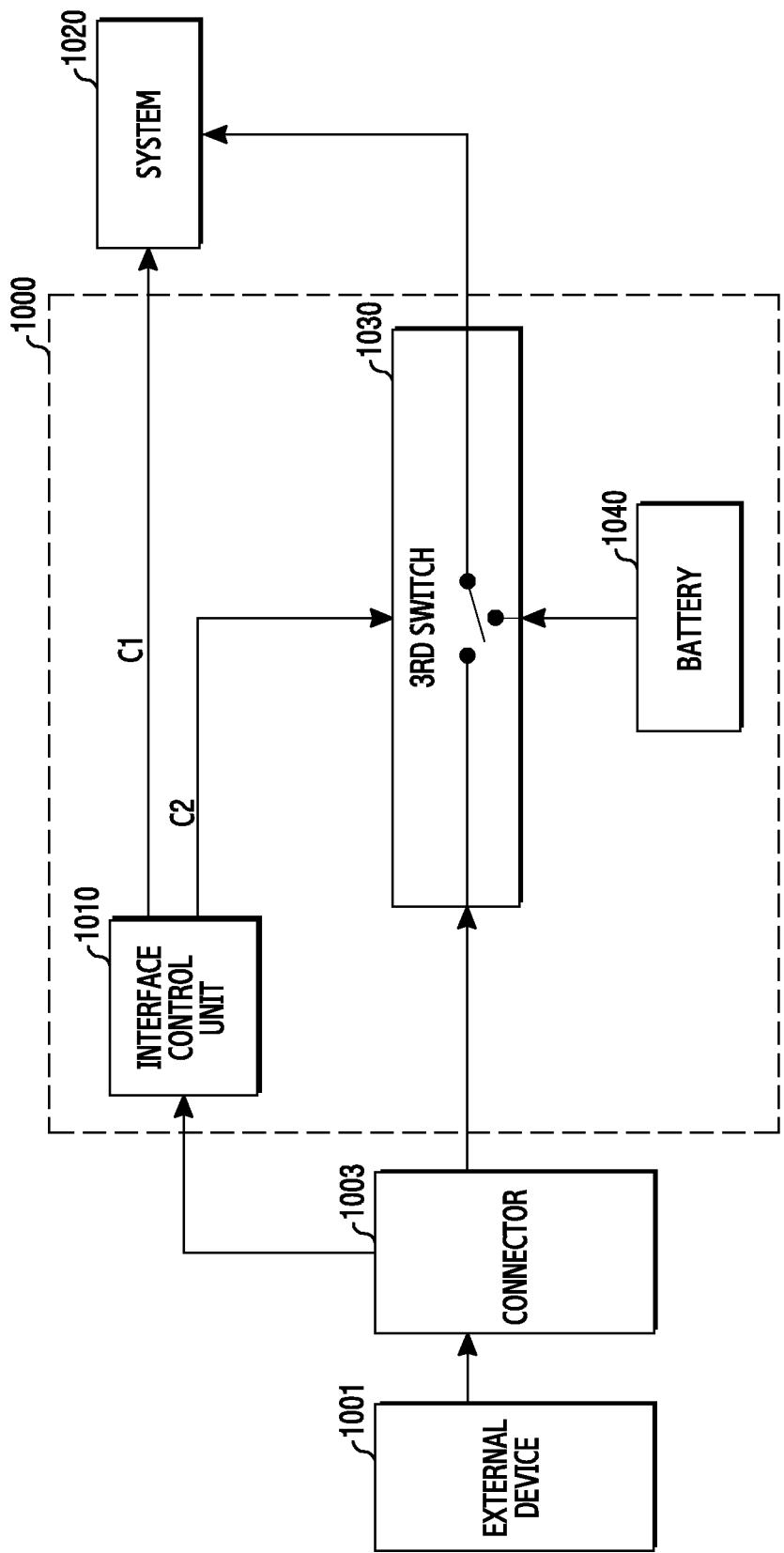
FIG. 10 illustrates a block diagram illustrating an electronic device including a power management module according to a further exemplary embodiment of the present disclosure.

FIG. 10 illustrates a block diagram illustrating an electronic device including a power management module according to a further exemplary embodiment of the present disclosure.

Referring to FIG. 10, in one exemplary embodiment, the power management module 1000 may include an interface control unit 1010, a system 1020, a 3rd switch 1030, a battery 1040 and the like.

In a comparison of FIG. 4 and FIG. 10, in one exemplary embodiment, the 1st switch and 2nd switch of FIG. 4 may be implemented in the form of being integrated into the 3rd switch 1030 of FIG. 10.

In one exemplary embodiment, in case where the 3rd switch 1030 receives a signal having a high level from the interface control unit 1010 according as an external device 1001 is coupled to the electronic device 101, the 3rd switch 1030 may perform a switching operation for coupling the connector 1003 and the system 1020 (or maintaining the coupling between the connector 1003 and the system 1020).

In another exemplary embodiment, in case where the 3rd switch 1030 receives a signal having a low level from the interface control unit 1010, the 3rd switch 1030 may perform a switching operation for coupling the battery 1040 and the system 1020 (or maintaining the coupling between the battery 1040 and the system 1020).

Figure 11:
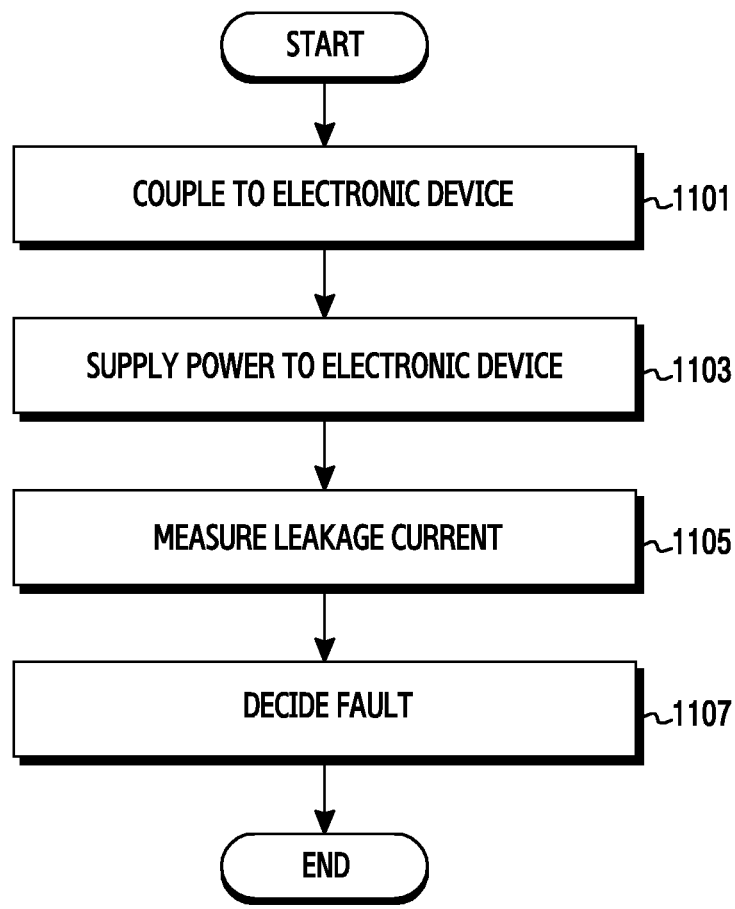
FIG. 11 is a flowchart illustrating a method for measuring a leakage current in a current detecting device according to one exemplary embodiment of the present disclosure.

FIG. 11 is a flowchart illustrating a method for measuring a leakage current in a current detecting device according to one exemplary embodiment of the present disclosure.

Referring to FIG. 11, in operation 1101, the current detecting device may be coupled to the electronic device 101. For example, the current detecting device may be coupled to a connector of the electronic device 101 through a jig cable. However, the disclosed invention is not limited to this.

In operation 1103, if the current detecting device is coupled with the electronic device 101 in operation 1101, the current detecting device may supply its power to the electronic device 101. For example, the current detecting device may apply a voltage to the electronic device 101, or supply a current. However, the disclosed invention is not limited to this. In one exemplary embodiment, the current detecting device may supply its power to the electronic device 101 through the connector when the electronic device 101 is turned off.

In operation 1105, the current detecting device may measure a leakage current, based at least on power received from the electronic device 101 in response to the power supplied to the electronic device 101 by the current detecting device. For example, the current detecting device may determine, as a leakage current, a magnitude of a current received from the electronic device 101. However, the disclosed invention is not limited to this.

In operation 1107, the current detecting device may determine the fault or non-fault of the electronic device 101 (or system), based at least on the measured leakage current. For example, in case where the current received from the electronic device 101 is equal to or is greater than a threshold value (e.g., 100 mA), the current detecting device may determine that the electronic device 101 (or system) is faulty. However, the disclosed invention is not limited to this.

Figure 12B:
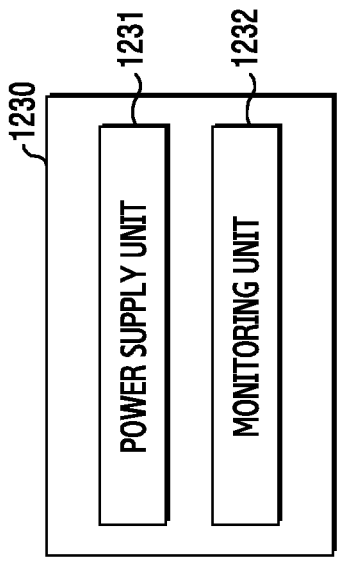
FIG. 12A and FIG. 12B illustrate a block diagram of a current detecting device according to one exemplary embodiment of the present disclosure.
Figure 12A:
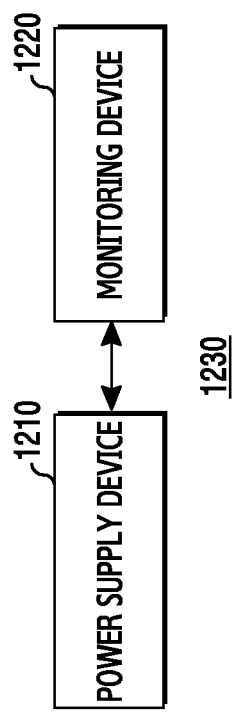

FIG. 12A and FIG. 12B illustrate a block diagram of a current detecting device according to one exemplary embodiment of the present disclosure.

Referring to FIG. 12A and FIG. 12B, in FIG. 12A, a current detecting device 1230 may include a power supply device 1210 and a monitoring device 1220. For example, the current detecting device 1230 may include the power supply device 1210 and the monitoring device 1220 as independent constructions.

In one exemplary embodiment, the power supply device 1210 may supply a power to the electronic device 101. For example, the power supply device 1210 may apply a voltage to the electronic device 101, or supply a current. However, the disclosed invention is not limited to this. In one exemplary embodiment, the power supply device 1210 may supply a power to the electronic device 101 through a connector when the electronic device 101 is turned off.

In one exemplary embodiment, the monitoring device 1220 may measure a leakage current, based at least on power received in response to the power supplied to the electronic device 101. For example, the monitoring device 1220 may determine, as a leakage current, a magnitude of a current received from the electronic device 101. However, the disclosed invention is not limited to this.

In one exemplary embodiment, the monitoring device 1220 may determine the fault or non-fault of the electronic device 101 (or system), based at least on the measured leakage current. For example, in case where the current received from the electronic device 101 is equal to or is greater than a threshold value (e.g., 100 mA), the monitoring device 1220 may determine that the electronic device 101 (or system) is faulty. However, the disclosed invention is not limited to this.

In one exemplary embodiment, FIG. 12B illustrates an example in which the current detecting device 1230 is implemented as one integral device. For example, the current detecting device 1230 may include a power supply unit 1231 and a monitoring unit 1232.

In one exemplary embodiment, the power supply unit 1231 and the monitoring unit 1232 perform the same or similar functions with the power supply device 1210 and the monitoring device 1220 of FIG. 12A and thus, their detailed descriptions are omitted.

A method for detecting a leakage current and an electronic device supporting the same according to various exemplary embodiments of the present disclosure control a power state of a system and a power supply path thereof in accordance with an external device coupled to the electronic device, thereby being able to detect a leakage current generated in the electronic device where the battery is integrally combined within a housing of the electronic device.

A method according to various exemplary embodiments of the present disclosure, may include the operations of detecting, by an interface control unit, a coupling of an external device to an electronic device; identifying, by the interface control unit, a type of the coupled external device; when the external device is identified as a current detecting device, generating, by the interface control unit, a first control signal for turning off power to one or more sub-systems of the electronic device, and a second control signal for setting a first path to supply the one or more sub-systems with power from the current detecting device; and transmitting, by the interface control unit, the first control signal to the one or more sub-systems and the second control signal to one or more switches.

In one exemplary embodiment, the first path may include a path coupling a connector of the electronic device to the one or more sub-systems via the one or more switches.

In one exemplary embodiment, the switch may include a first switch and a second switch, and the method may further include the operations of when the second control signal for setting the first path is received by the one or more switches, coupling, via the first switch, the connector of the electronic device to the second switch; and coupling, via the second switch, the first switch to the one or more sub-systems.

In one exemplary embodiment, the first switch and/or the second switch may be included in an Interface Power Management Integrated Circuit (IF PMIC) or a Power Management Integrated Circuit (PMIC).

In one exemplary embodiment, the switch may include one integrated switch, and the method may include the operation of when the second control signal for setting the first path is received by the one integrated switch, the method further comprising coupling, by the one integral switch, a connector of the electronic device to the one or more sub-systems.

In one exemplary embodiment, the interface control unit may be included in a Channel Configuration Integrated Circuit (CC IC).

In one exemplary embodiment, the current detecting device may a leakage current generated in the one or more sub-systems, based at least on the power supplied by the current detecting device to the one or more sub-systems, and may determine the electronic device as faulty when the leakage current is equal to or is greater than a designated threshold value.

In one exemplary embodiment, the method may further include the operations of when the type of the detected external device is a travel adapter, generating, by the interface control unit, a third control signal for turning on the power to the one or more sub-systems, and a fourth control signal for setting the first path to supply the one or more sub-systems with the power from the travel adapter; and transmitting, by the interface control unit, the third control signal to the one or more sub-systems and the fourth control signal to the one or more switches.

In one exemplary embodiment, the method may further include the operations of receiving an input for powering on the electronic device when the external device is not coupled to the electronic device; generating, by the interface control unit, a third control signal for turning on the power to the one or more sub-systems, and a fourth control signal for setting a second path to supply power from a battery to the one or more sub-systems; and transmitting, by the interface control unit, the third control signal to the one or more sub-systems and the fourth control signal to the one or more switches.

In one exemplary embodiment, a battery included in the electronic device may be integrated within a housing of the electronic device.

Also, a structure of data used in the aforementioned exemplary embodiment of the present disclosure may be recorded in a computer-readable recording medium through various means. The computer-readable recording medium includes a storage medium such as a magnetic storage medium (for example, a Read Only Memory (ROM), a floppy disc, a hard disc, etc.) and/or an optical reading medium (for example, a Compact Disc-ROM (CD-ROM), a Digital Versatile Disc (DVD), etc.).

In one exemplary embodiment, a computer-readable recording medium that records a program for executing at least one operation in a storage medium having stored commands may be provided. The commands may be set to perform, by at least one processor, the at least one operation when the commands are executed by the at least one processor. The at least one operation may include the operations of detecting, by an interface control unit, the coupling of an external device to an electronic device, deciding, by the interface control unit, the type of the coupled external device, if the decided type of the external device is a current detecting device, generating, by the interface control unit, a 1st control signal for turning-off a power source of a system, and a 2nd control signal for setting a 1st path for supplying the system with a power source inputted from the current detecting device, and forwarding, by the interface control unit, the 1st control signal for turning-off the power source of the system to the system, and transmitting the 2nd control signal for setting the 1st path to the switch.

The above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

Hitherto, the present invention has been described using preferred exemplary embodiments. A person having ordinary skill in the art will be able to understand that the present invention may be implemented in a modified form without departing from the intrinsic characteristic of the present invention. Therefore, disclosed exemplary embodiments should be taken into consideration as descriptive and not restrictive. The scope of the present invention is presented in the appended claims, not in the aforementioned description, and all differences within a scope equivalent thereto will have to be construed as being included in the present invention.

What is claimed is:

1. An electronic device comprising:
   one or more switches;
   one of more sub-systems; and
   an interface control unit electrically coupled with the one or more sub-systems and the one or more switches, wherein the interface control unit is configured to:
   detect a coupling of an external device to the electronic device,
   identify a type of the coupled external device,
   when the external device is identified as a current detecting device, generate a first control signal for turning off power to the one or more sub-systems, and a second control signal for setting a first path to supply the one or more sub-systems with power from the current detecting device, and
   transmit the first control signal to the one or more sub-systems and the second control signal to the one or more switches.

2. The electronic device of claim 1, wherein the first path comprises a path coupling a connector of the electronic device to the one or more sub-systems via the one or more switches.

3. The electronic device of claim 2, wherein the one or more switches comprises a first switch and a second switch, and
   when the second control signal for setting the first path is received by the one or more switches, the first switch couples the connector of the electronic device to the second switch, and the second switch couples the first switch to the one or more sub-systems.

4. The electronic device of claim 3, wherein the first switch and/or the second switch are included in an Interface Power Management Integrated Circuit (IF PMIC) or a Power Management Integrated Circuit (PMIC).

5. The electronic device of claim 1, wherein the one or more switches comprises one integrated switch, and
   when the second control signal for setting the first path is received by the one integrated switch, the one integrated switch couples a connector of the electronic device to the one or more sub-systems.

6. The electronic device of claim 1, wherein the interface control unit is included in a Channel Configuration Integrated Circuit (CC IC).

7. The electronic device of claim 1, wherein the current detecting device measures a leakage current generated in the one or more sub-systems, based at least on the power supplied by the current detecting device to the one or more sub-systems, and
   determines the electronic device as faulty when the measured leakage current is equal to or is greater than a designated threshold value.

8. The electronic device of claim 1, wherein when the type of the detected external device is a travel adapter, the interface control unit is configured to:
   generate a third control signal for turning on the power to the one or more sub-systems, and a fourth control signal for setting the first path to supply the one or more sub-systems with the power from the travel adapter, and
   transmit the third control signal to the one or more sub-systems and the fourth control signal to the one or more switches.

9. The electronic device of claim 1, wherein when the electronic device receives an input for powering on the electronic device and the external device is not coupled to the electronic device,
   the interface control unit is configured to:
   generate a third control signal for turning on the power to the one or more sub-systems, and a fourth control signal for setting a second path to supply power from a battery to the one or more sub-systems, and
   transmit the third control signal to the one or more sub-systems and the fourth control signal to the one or more switches.

10. The electronic device of claim 1, further comprising a battery that is integrated within a housing of the electronic device.

11. A method comprising:
    detecting, by an interface control unit of an electronic device, a coupling of an external device to the electronic device;
    identifying, by the interface control unit, based on information received from the external device, a type of the coupled external device;
    identifying, by the interface control unit, that the external device which is coupled to the electronic device is a current detecting device, based on the information including an identification of the current detecting device;
    generating, by the interface control unit, a first control signal for turning off power to one or more sub-systems of the electronic device, and a second control signal for setting a first path to supply the one or more sub-systems with power from the current detecting device; and
    transmitting, by the interface control unit, the first control signal to the one or more sub-systems and the second control signal to one or more switches of the electronic device.

12. The method of claim 11, wherein the first path comprises a path coupling a connector of the electronic device to the one or more sub-systems via the one or more switches.

13. The method of claim 12, wherein the one or more switches comprises a first switch and a second switch, and the method further comprising:
    in response to receiving, by the one or more switches, the second control signal for setting the first path, coupling, via the first switch, the connector of the electronic device to the second switch; and
    coupling, via the second switch, the first switch to the one or more sub-systems.

14. The method of claim 13, wherein the first switch and/or the second switch are included in an Interface Power Management Integrated Circuit (IF PMIC) or a Power Management Integrated Circuit (PMIC).

15. The method of claim 11, wherein the one or more switches comprises one integrated switch, and in response to receiving, by the one or more switches, the second control signal for setting the first path, the method further comprising coupling, by the one integral switch, a connector of the electronic device to the one or more sub-systems.

16. The method of claim 11, wherein the interface control unit is included in a Channel Configuration Integrated Circuit (CC IC).

17. The method of claim 11, further comprising:

measuring, by the current detecting device, a leakage current generated in the one or more sub-systems, based at least on the power supplied by the current detecting device to the one or more sub-systems, and determining, by the current detecting device, the electronic device as faulty in response to identifying that the leakage current is equal to or is greater than a designated threshold value.

* * * * *